(12) United States Patent
Nagamatsu et al.

(10) Patent No.: US 6,414,885 B2
(45) Date of Patent: Jul. 2, 2002

(54) SEMICONDUCTOR INTEGRATED CIRCUIT AND INTEGRATED CIRCUIT SYSTEM

(75) Inventors: Toshiyuki Nagamatsu; Hiroshi Yamauchi, both of Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/739,402

(22) Filed: Dec. 19, 2000

(30) Foreign Application Priority Data

Dec. 28, 1999 (JP) .......................................... P11-375843

(51) Int. Cl.⁷ ................................................ G11C 7/00
(52) U.S. Cl. .............. 365/200; 365/230.03; 365/230.06
(58) Field of Search ........................... 365/200, 189.05, 365/189.11, 230.03, 51, 230.06

(56) References Cited

U.S. PATENT DOCUMENTS 4,901,320 A  *  2/1990  Sawada et al. ................ 714/15
5,848,009 A  * 12/1998  Lee et al. .................... 365/200
5,940,335 A  *  8/1999  Kirihata ....................... 365/200
6,031,758 A  *  2/2000  Katayama et al. ..... 365/185.09
6,141,267 A  * 10/2000  Kirihata et al. ............. 365/200
6,178,126 B1 *  1/2001  Kirihata et al. ............. 365/200
6,236,601 B1 *  5/2001  Katayama et al. .......... 365/200

FOREIGN PATENT DOCUMENTS

JP          10-177799           6/1998

* cited by examiner

Primary Examiner—David Nelms
Assistant Examiner—Gene N. Auduong
(74) Attorney, Agent, or Firm—Finnegan, Henderson, Farabow, Garrett & Dunner, L.L.P.

(57) ABSTRACT

A memory space controller controls a part of normal regions of memory space as a redundancy region for relieving faulty regions. The memory space controller relocates the faulty regions to the part of the normal regions at a final address side of a memory space, thereby forming a continuous memory space. The memory space controller includes at least a faulty address storing table unit, a replace address storing table unit, a first address agreement/disagreement detecting circuit, and an address data selecting circuit.

29 Claims, 10 Drawing Sheets

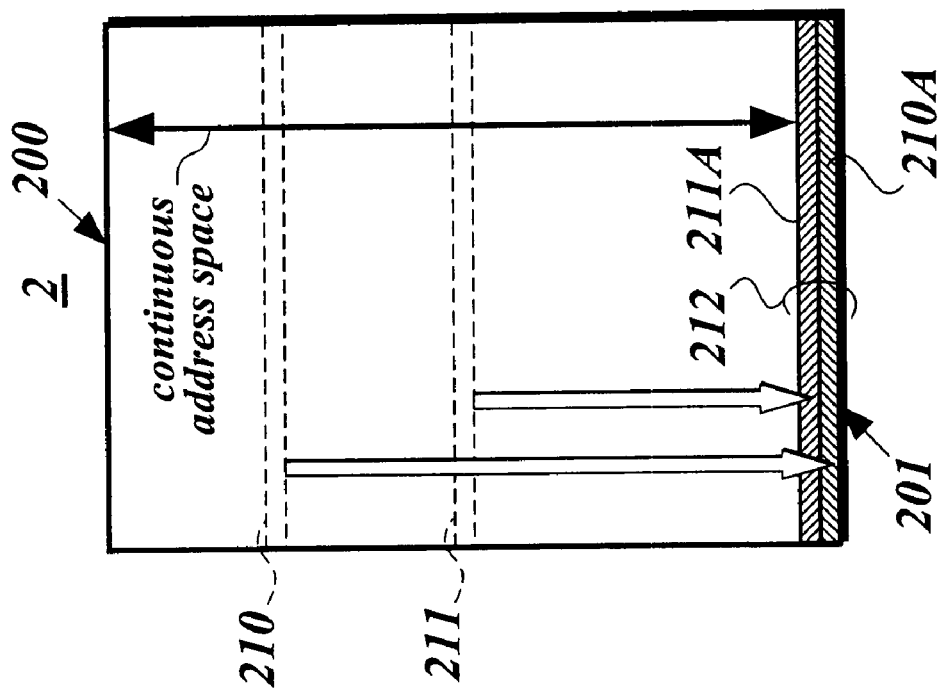
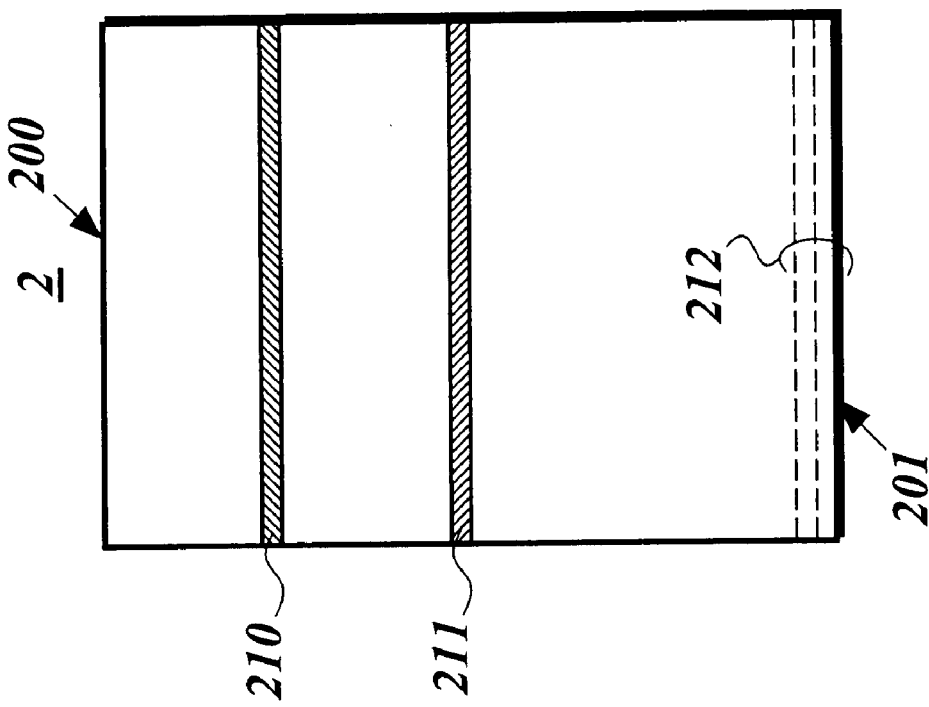

SEMICONDUCTOR INTEGRATED CIRCUIT AND INTEGRATED CIRCUIT SYSTEM

CROSS-REFERENCE TO RELATED APPLICATION

This application claims benefit of priority under 35 USC §119 to Japanese Patent Application No. 1999-375843, filed on Dec. 28, 1999, the entire contents of which are incorporated by reference herein.

BACKGROUND OF THE INVENTION

1. Field of the Invention

This invention relates to a semiconductor integrated circuit and an integrated circuit system. More particularly, the invention relates to a semiconductor integrated circuit which is preferable to relieve faulty regions in a memory space, and an integrated circuit system including such a semiconductor integrated circuit mounted on a mounting board.

2. Description of the Related Art

A dynamic random access memory (called the "DRAM") which is a typical example of a readable/writable semiconductor memory tends to have a large capacity in response to increased integration. A memory cell for storing one-bit data of the DRAM is constituted by a series circuit including switching elements and data storing capacitive elements. A plurality of memory cells are arranged in the shape of matrix at intersections of a plurality of data lines and a plurality of word lines, thereby forming a memory space (a memory cell array).

One of technical problems related to such a DRAM is to improve yield in a semiconductor manufacturing process. It is assumed here that one memory cell is faulty. Such a faulty memory cell cannot be accessed at random during writing or reading data, so that the DRAM is judged to be defective. Further, even if one data line or one word line is disconnected, a plurality of memory cells (i.e. a memory cell block) belonging to the disconnected data line or word line cannot be accessed at random during writing or reading data. Therefore, the DRAM is judged to be defective. Usually, the DRAM is provided with a spare redundancy circuit in addition to the memory space in order to relieve faulty regions and improve the manufacturing yield.

On the other hand, a NAND type electrically erasable non-volatile memory (called the "EEPROM") which is a typical read-only semiconductor memory tends to have a large capacity due to increased integration similarly to the foregoing DRAM. A memory cell for storing one-bit data of the EEPROM comprises a MOSFET (metal oxide semiconductor field effect transistor) having a floating gate electrode as a data storing section. Several or several ten memory cells are connected in series, arranged between data lines and source lines, and connected to word lines. Similarly to the DRAM, the memory cells are arranged in the shape of a matrix in order to constitute a memory space.

In the EEPROM, it is acceptable that there are faulty regions in the memory space. The EEPROM stores data of faulty regions and normal regions in each block unit or each address unit, and control operations are performed so as not to access the faulty regions. The data of the faulty regions and normal regions are stored in a controller outside the EEPROM, thereby preventing the faulty regions of the EEPROM from being accessed.

The foregoing semiconductor memory seems to suffer from the following problems.

Provided with the redundancy circuit in order to relieve the faulty region in addition to the memory space, the DRAM has to increase a semiconductor chip area, and is difficult to promote high integration and capacity increase.

Further, if there are more faulty regions in the memory space of the DRAM than the predetermined quantity allowable in the redundancy circuit, it is not always possible to relieve such faulty regions. As a result, the DRAM will be judged to be defective, which reduces the yield of a semiconductor manufacturing process.

The foregoing problem is not peculiar to the DRAM. For instance, a readable/writable semiconductor memory such as a static type random access memory (called the "SRAM") also suffers from the similar problem.

On the other hand, addresses in the memory space become non-contiguous, and address control is complicated in the EEPROM since data reading is controlled by escaping addresses of faulty regions.

Further, since the faulty regions are also accessed in the memory space of the EEPROM, access time is unnecessarily increased, and read-out speed is lowered.

Such problems are also noted in an ultra violet erasable non-volatile memory (EPROM) and a read-only memory (ROM).

SUMMARY OF THE INVENTION

The present invention is aimed at overcoming the foregoing problems of the related art. It is an object of the invention to provide a semiconductor integrated circuit and an integrated circuit system which can relieve faulty regions and promote circuit integration.

A further object of the invention is to provide a semiconductor integrated circuit and an integrated circuit system which can accelerate operation.

A still further object of the invention is to provide a semiconductor integrated circuit and an integrated circuit system which can relieve faulty regions during a manufacturing process, accelerated tests, use by users, and so on.

A final object of the invention is to provide a semiconductor integrated circuit and an integrated circuit system which can improve yield of a manufacturing process by relieving faulty regions.

According to a first feature of the invention, a semiconductor integrated circuit comprises a circuit for outputting address data of a part of normal regions in a memory space on the basis of received address data of a faulty region in the memory space, and controlling the relief of the faulty region using the part of normal regions of the memory space as a redundancy region.

In this specification, the term "memory space" denotes a memory cell array where data can be written in and read from memory cells arranged in the shape of matrix, and refers to both two-dimensional and three-dimensional memory spaces. The DRAM, SRAM and so on are readable/writable memory cells. The ROM, EEPROM, EPROM and so on are read-only memory cells. The memory space constituted by these memory cells is used as a memory space of a memory chip, as a memory space included in a logic chip, as a memory space mounted on a memory board or a logic board. The term "normal region" represents a memory cell or a plurality of memory cells (or memory block) where data are normally read and written. The term "faulty region" represents a memory cell or a plurality of memory cells where data cannot be normally read and written. The term "redundancy region" represents a relief region which can relieve a faulty region in the memory space by using a part of the normal regions of the memory space. In this memory cell array controller, the parts of normal regions usable as the redundancy regions are variable with the number of faulty regions.

According to a second feature of the invention, a semiconductor integrated circuit comprises: (a) a faulty address storing table unit for storing address data of a faulty region of a memory space; (b) a replace address storing table unit for storing replace address data in which the address data of the faulty region are replaced with address data of a part of a normal region of the memory space; (c) a first address agreement/disagreement detecting circuit for detecting whether or not the address data of the faulty region stored in the faulty address storing table unit agree with an address signal; and (d) an address data selecting circuit for outputting the replace address data stored in the replace address storing table unit when the address data of the faulty region agree with the address signal, or outputting the address signal when the replace address data do not agree with the address signal. Further, the second feature of the invention, the semiconductor integrated circuit comprising a second address agreement/disagreement detecting circuit for outputting an invalid address signal when said replace address data agree with said address signal.

In accordance with a third feature of the invention, there is provided an integrated circuit system comprising: (a) a first semiconductor memory including at least a first memory space and a first address decoder; (b) a second semiconductor memory including at least a second memory space and a second address decoder; (c) a relief address storing table unit for storing address data of a relief region where the faulty region in the first memory space is relieved; (d) a replace address storing table unit for storing replace address data in which the address data of the relief region is replaced with address data of a part of a normal region of the second memory space; (e) a first address agreement/ disagreement detecting circuit for detecting whether or not the address data of the faulty region stored in the faulty address storing table unit agree with an address signal; and (f) an address data selecting circuit for outputting the replace address data stored in the replace address storing table unit to the second address decoder when the address data of the faulty region agree with the address signal, and outputting the address signal when the replace address data of the relief region do not agree with the address signal. Further, the third feature of the invention, the integrated circuit system comprising a second address agreement/disagreement detecting circuit for outputting an invalid address signal when said replace address data agree with said address signal.

BRIEF DESCRIPTION OF THE DRAWINGS

FIG. 3(A) is a schematic block diagram of the memory space having faulty regions in the semiconductor memory.

FIG. 3(B) is a schematic block diagram showing that the faulty regions are replaced with a part of normal regions in the memory space of the semiconductor memory.

DESCRIPTION OF THE PREFERRED EMBODIMENTS

The invention will be described with reference to the preferred embodiments shown in the accompanying drawings.

FIRST EMBODIMENT OF THE INVENTION

In the first embodiment of the invention, a semiconductor memory or a semiconductor integrated circuit includes a memory space controller. In this specification, DRAM is described as one example of the semiconductor memory according to the invention.

[SYSTEM CONFIGURATION OF CIRCUIT]

Figure 1:
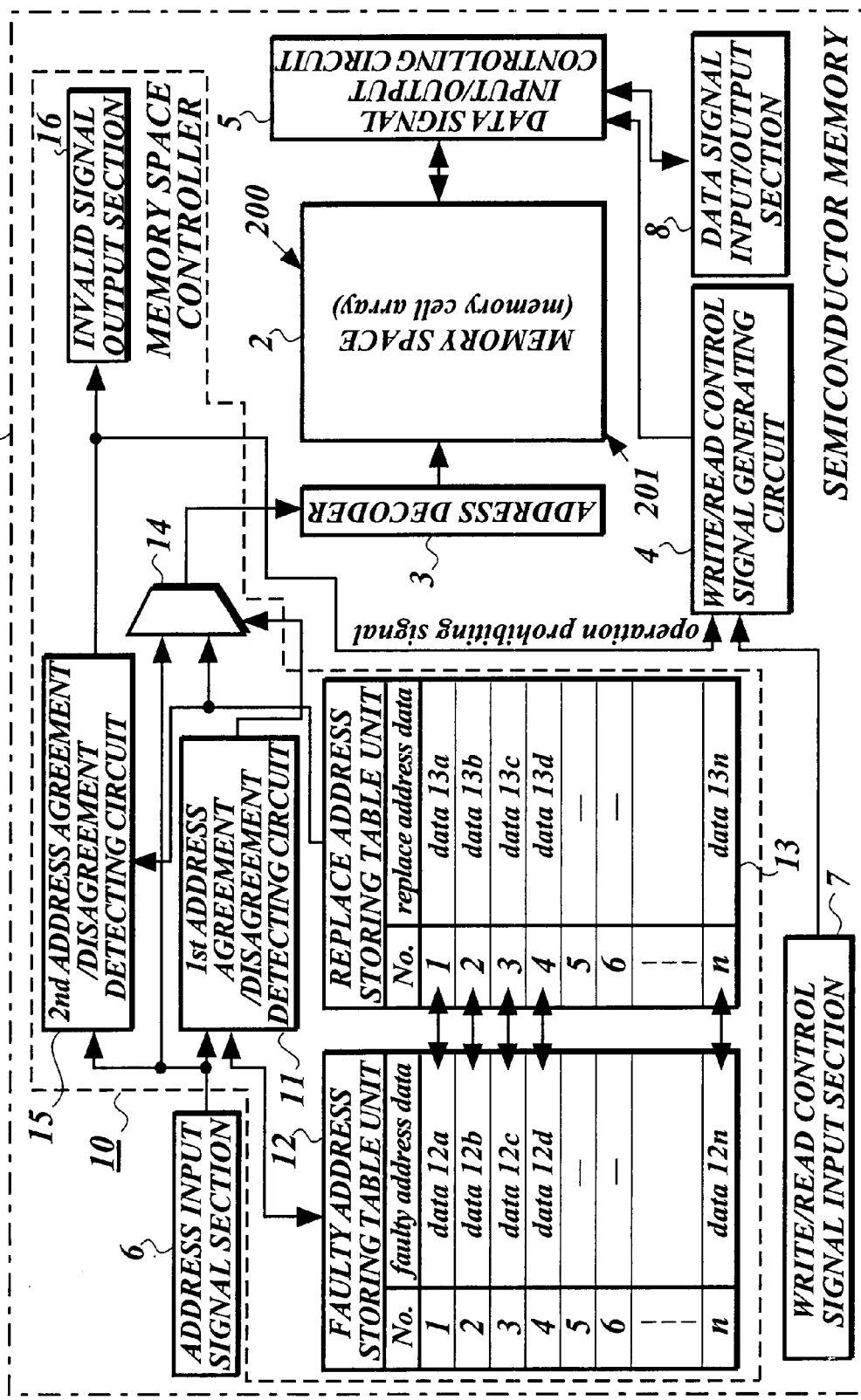
FIG. 1 is a system block diagram of a semiconductor memory according to a first embodiment of the invention.

Referring to FIG. 1, the semiconductor memory 1 includes: a memory space (or memory address space) 2; an address decoder 3; a write/read control signal generating circuit 4; a data signal input/output control circuit 5; an address signal input section 6; a write/read control signal input section 7; a data signal input/output section 8; and a memory space controller 10.

Figure 2:
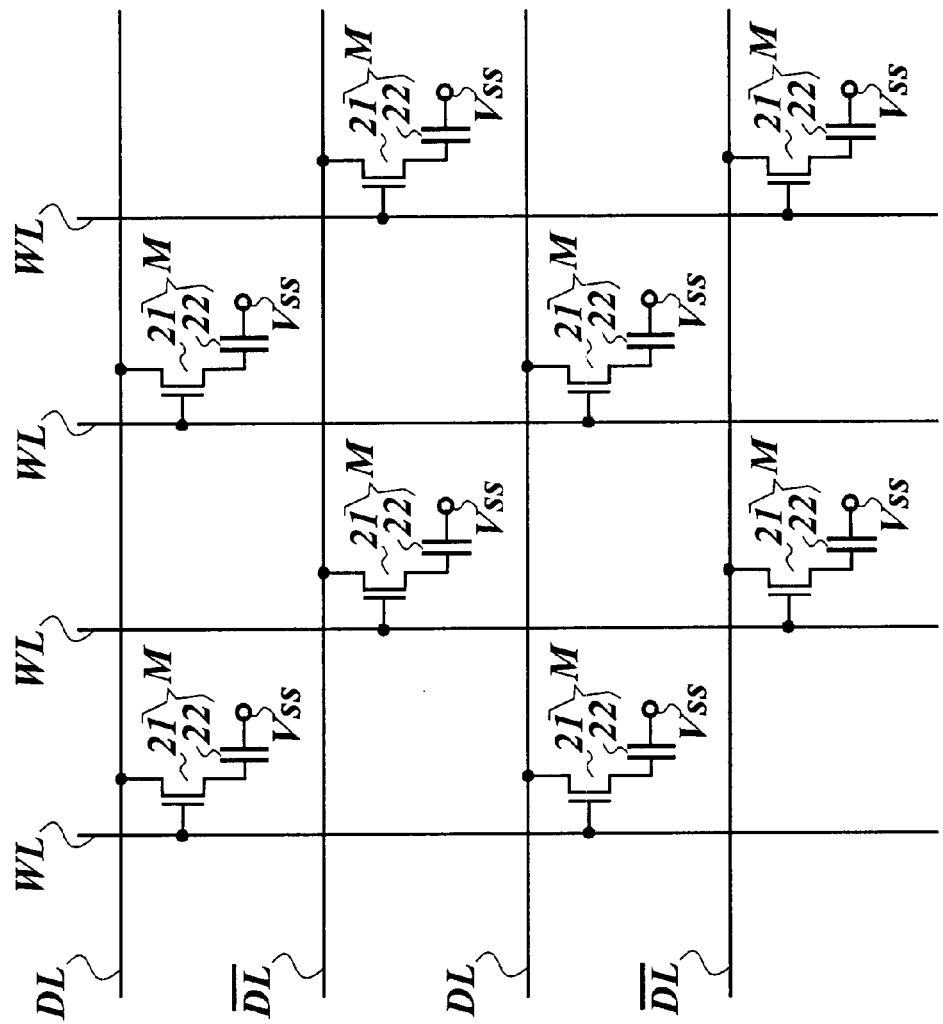
FIG. 2 is a diagram of an equivalent circuit of a memory space (a memory cell array) in the semiconductor memory of FIG. 1.
Figure 4:
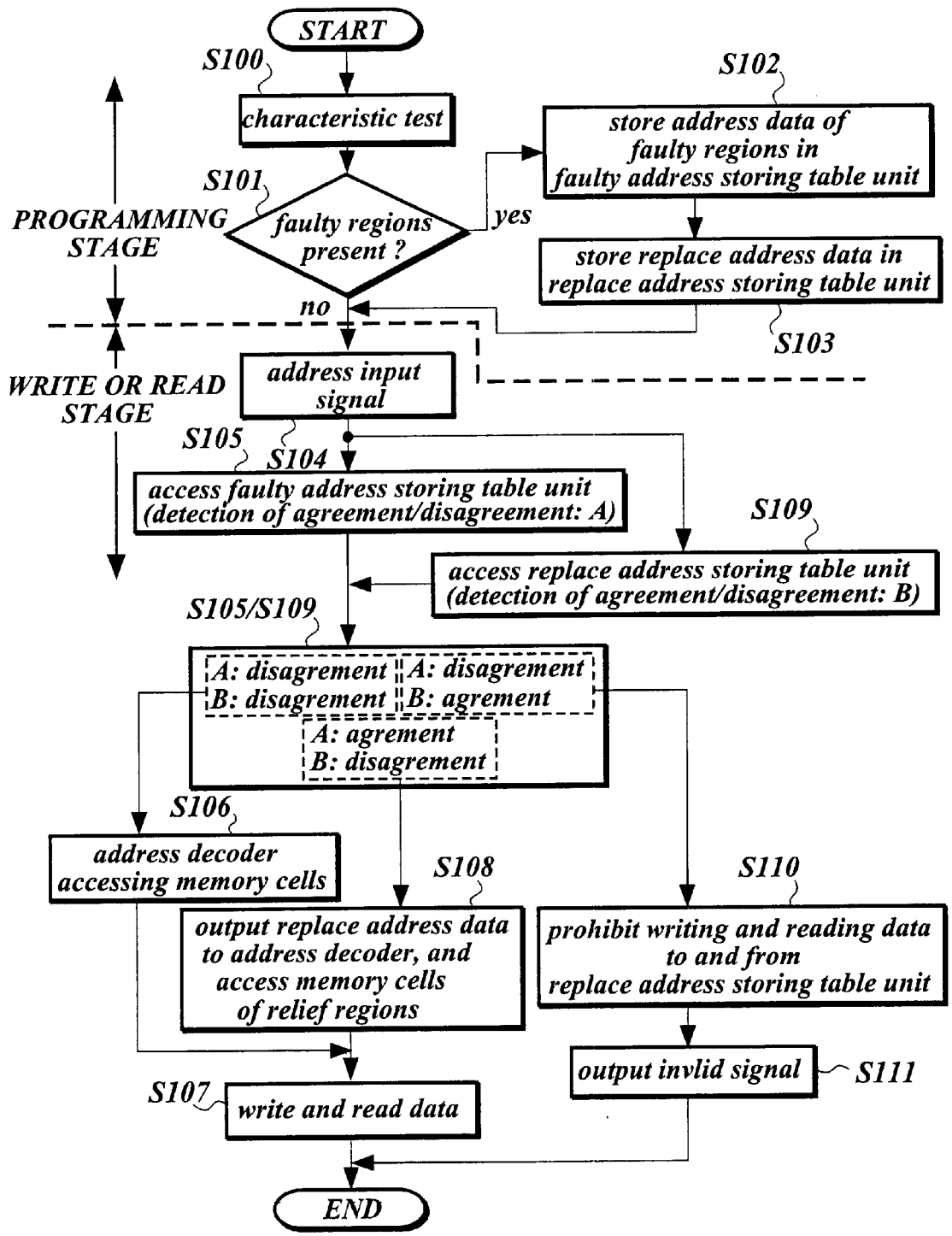
FIG. 4 is a flow chart showing the system operation of the semiconductor memory of the first embodiment.

As shown in FIG. 2, the memory space 2 includes a plurality of data lines DL and a plurality of word lines WL, and one memory cell M store one-bit data is arranged at an intersection of each data line DL and each word line WL. Referring to FIG. 2, each data line DL extends to the left and right, and a plurality of data lines DL are vertically provided with predetermined spaces maintained therebetween. Each word line WL vertically extends, and a plurality of word lines WL are provided with predetermined spaces maintained therebetween. In other words, the memory space 2 is constituted by a plurality of memory cells M which are arranged in the shape of a matrix.

Each memory cell M is constituted by a series circuit of an insulated gate field effect transistor (called the "IGFET" hereinafter) 21 for the switching operation (i.e. for selecting the memory cell) and a capacitive element 22 for data storage. In the first embodiment, the term "IGFET" includes MOSFET (metal-oxide semiconductor field effect transistor), "MISFET" (metal-insulator semiconductor field effect transistor) and so on. The switching IGFET 21 has one main electrode region (source region or drain region) electrically connected to the data line DL, the other main electrode region (drain region or source region) electrically connected to one electrode of the data storing capacitive element 22, and a control electrode (gate electrode) thereof electrically connected to the word line WL. The other electrode of the data storing capacitive element 22 is connected to a power source (fixed voltage) Vss. For instance, power source Vss is zero volts for a reference voltage of circuit.

The address decoder 3 selects a data line DL and a word line WL in the memory space 2 in response to an address signal in order to select a memory cell M of a designated address. Referring to FIG. 1, the address signal is sent to the address decoder 3 from an outside of the semiconductor memory 1 via the address signal input section 6.

The write/read control signal generating circuit 4 generates a control signal indicating either data writing or reading in or from the memory cell M of the designated address. The write/read control signal is transmitted to the write/read control signal generating circuit 4 from the outside of the semiconductor memory 1 via the write/read control signal input section 7.

The data signal input/output control circuit 5 writes data in the memory cell M whose address is specified by the control signal from the write/read control signal generating circuit 4, or reads the data from the memory cell M. The data are input into the data signal input/output control circuit 5 via the data signal input/output section 8, and are output to the outside from the data signal input/output control circuit 5 via the data signal input/output section 8.

The memory space controller 10 is positioned between the address signal input section 6 and the address decoder 3. The memory space controller 10 includes a circuit for outputting address data of a part of the normal regions in the memory space 2 on the basis of the address data of the faulty regions of the memory space 2, so that the part of the normal regions is controlled as a redundancy region for relieving the faulty regions. In order to use the relieved faulty regions as a continuous address space, the memory space controller 10 controls a part of the normal regions on the final address side 201 (or the initial address side 200) as the redundancy region (i.e. controls a part of the normal regions as the relief region). In the semiconductor memory 1 according to the invention, the address of the initial address side 200 is preferably decided (e.g. it is convenient to use the address "zero" as a start point) so that a part of the normal regions is assigned to the final address side 201 in the memory space 2 in order to relieve faulty regions.

The memory space controller 10 includes: a faulty address storing table unit 12 for storing address data of a faulty region in the memory space 2; a replace address storing table unit 13 for storing replace address data in which the address data of the faulty region are replaced with address data of a part of normal regions in the memory space 2; a first address agreement/disagreement detecting circuit 11 for detecting whether or not the address data of the faulty region in the faulty address storing table unit 12 agrees with an address signal; and an address data selecting circuit 14 for outputting replace address data, stored in the replace address storing table unit 13, to the address decoder 3 when the address data of the faulty region agree with the address signal, and directly transfers the address signal to the address decoder 3 when the address data of the faulty regions do not agree with the address signal. In addition, the memory space controller 10 includes: a second address agreement/disagreement detecting circuit 15 for sending an invalid address signal when the replace address data agree with the address signal; and an invalid signal output section 16 for sending the invalid address signal to the outside from the second address agreement/disagreement detecting circuit 15.

Referring to FIG. 3(A), the memory space 2 has two faulty regions 210 and 211 between the initial address side 200 and the final address side 201. It is assumed here that one address constitutes one faulty region (one memory cell M). In the memory space 2, one memory cell line or one memory cell row (composed of a plurality of memory cells M) electrically connected to one data line DL are assigned a plurality of addresses, each of faulty regions 210 and 211 is established as a set containing a plurality of faulty memory cells M. In other words, if one data line DL happens to be disconnected, a plurality of memory cells M electrically connected to this one data line DL will not be accessible. According to the first embodiment of the invention, set of a plurality of the memory cell M will be treated as one faulty region 210 or one faulty region 211 (one faulty memory block).

The faulty address storing table unit 12 of the memory space controller 10 stores addresses of the faulty region 210 as "data 12a", and addresses of the faulty region 211 as "data 12b". The faulty address storing table unit 12 stores "n" address data 12a to 12n of "n" faulty regions. A storage capacity (a size of redundancy regions) for the address data of the faulty region is determined when designing the semiconductor memory 1, and is preferably approximately 0.05% to 0.20%, or more preferably approximately 0.10% of the total storage capacity of the memory space 2, which is effective in reliably relieving faulty regions as well as increasing the capacity of the memory space 2.

The faulty address storing table unit 12 can freely vary the number of the address data of the faulty regions within the quantity "n" mentioned above, and allow the updating of the address data of the faulty regions as desired. The address data of the faulty regions may be stored during or after the manufacturing process of the semiconductor memory 1, or during the use by a user. Specifically, the period during the manufacturing process includes the time when the wafer process is completed, the time when a semiconductor chip is being made after the dicing, the time when the packaging is completed, and so on. The period after the manufacturing process includes the time when accelerated tests are completed, and so on. The address data of faulty regions are preferably stored (i.e. programmed) on the basis of results of characteristic tests performed when the predetermined manufacturing processes are completed. For instance, the faulty address data storing table unit 12 is provided with a ROM, or is provided particularly with an EEPROM or an EPROM when it is necessary to repeatedly update the address data or when it is necessary to update the address data in a state where the semiconductor memory 1 is substantially completed, in order to shorten the manufacturing period. Further, the faulty address storing table unit 12 is provided with fuse elements, which are disconnected in order to store the address data of faulty regions.

In the memory space 2 shown in FIG. 3(B), in the direction of the initial address side 200 from the final address side 201, a region (a part) 212 of the normal regions at the final address side 201 is used as a relief region 210A for relieving the faulty region 210 and a relief region 211A for relieving the faulty region. The term "relief region" represents that a region 212 of the normal region which can constitute a continuous address space in the memory space 2 is used as a region for relieving the faulty region. The relief region has a storage capacity that is equal to that of the faulty region. One memory cell line (composed of a plurality of memory cells M) connected to one data line DL per address constitutes one relief region, or a plurality of memory cell line (a memory cell line block) connected to a plurality of data lines DL constitute one relief region. When faulty regions are present along word lines WL, the relief regions are also present along word lines WL (see FIG. 2).

The replace address storing table unit 13 stores the address data of the relief region 210A in the memory space 2, shown in FIG. 3(B), as the replace address data 13a, and the address data of the relief region 211A as the replace address data 13b. The replace address data 13a to data 13n stored in the replace address storing table unit 13 correspond, one to one basis, to the faulty address data 12a to 12n stored in the faulty region address storing table unit 12. In other words, the replace address storing table unit 13 can store "n" replace address data 13a to 13n. The replace address data are preferably stored when the address data of faulty regions are stored. Similarly to the faulty address storing table unit 12, the replace address storing table unit 13 is provided with a ROM, an EEPROM or an EPROM, where the replace address data 13a and 13b of the relief regions 210A and 211A are stored.

In the faulty address storing table unit 12, valid flags are necessary in order to indicate the areas for storing address data of the faulty regions are valid (either they are storing the faulty address data or are in use) or invalid (either no the faulty address data are being stored or are not in use). It is preferable that the valid flags be included in the address data. Similarly, in the replace address storing table unit 13, valid flags are necessary in order to indicate that the areas for storing the replace address data are valid or invalid. The valid flags are preferably included in the replace address data.

Referring to FIG. 1, the first address agreement/disagreement detecting circuit 11 is connected to the address signal input section 6, faulty address storing table unit 12 and address data selecting circuit 14. This first address agreement/disagreement detecting circuit 11 continuously detects whether or not the address signal (which is input from the outside via the address signal input section 6) agrees with the address data of the faulty region, i.e. whether or not the address signal denotes the address data of the faulty region. When the address signal agrees with the address data of the faulty region, i.e. when it denotes the faulty region in the memory space 2, this is informed to the address data selecting circuit 14. Conversely, when the address signal does not agree with the address data of the faulty region, i.e. when it denotes a normal region in the memory space 2, this is directly informed to the address decoder 3 via the address data selecting circuit 14.

The address data selecting circuit 14 is connected to the address signal input section 6, first address agreement/disagreement detecting circuit 11 and replace address storing table unit 13. Specifically, the address data selecting circuit 14 outputs the replace address data from the replace address storing table unit 13 to the address decoder 3 in response to a signal indicating the agreement of the address signal with the address data of the faulty region from the first address agreement/disagreement detecting circuit 11. Further, the address data selecting circuit 14 outputs the address signal, from the address signal section 6, directly to the address decoder 3 in response to a signal indicating the disagreement of the address signal with the address data. A multiplexing circuit is used as the address data selecting circuit 14.

The second address agreement/disagreement detecting circuit 15 continuously detects whether or not the address signal, which is input from the address signal section 6, agrees with the replace address data in the replace address storing table unit 13, i.e. whether or not the address signal indicates the replace address data. When the address signal indicates the address data of the replace region for the faulty region in the memory space 2, this is informed to the invalid signal output section 16.

The invalid signal output section 16 transfers the invalid signal from the second address agreement/disagreement detecting circuit 15 to the outside.

[SYSTEM OPERATION OF CIRCUIT]

The system operation of the semiconductor memory 1 and memory space controller 10 will be described with reference to FIGS. 1 to 4.

(1) First of all, during or after the manufacturing process at the manufacturer or during the user's use, characteristic tests are performed for the whole system or particular parts of the system of the semiconductor memory 1 (step S100). The faulty regions 210 and 211 are detected in the memory space 2 based on the characteristic tests, as shown in FIG. 3(A) (step S101).

(2) In the memory space controller 10 of FIG. 1, the faulty address storing table unit 12 stores (Programs) the address data of the faulty region 210 as the address data 12a, and the address data of the faulty region 211 as the address data 12b (step S102). The address data 12a and 12b are sequentially stored from the initial address side 200 to the final address side 201 in the faulty address storing table unit 12. At the same time, the replace address storing table unit 13 stores (Programs) the address data of the relief region 210A (a part of the normal regions in the memory space 2) for relieving the faulty region 210 as the replace address data 13a, and the address data of the relief region 211A for relieving the faulty region 211A as the replace address data 13b (step S103). The replace address data 13a and 13b are sequentially stored from the final address side 201 to the initial address side 200 in the replace address storing table unit 13. Refer to FIGS. 1 and 3(B).

(3) When the address signal input section 6 of the semiconductor memory 1 shown in FIG. 1 receives the address signal (step S104), the address agreement/disagreement detecting circuit 11 of the memory cell controller 10 detects whether or not the address signal agrees with the address data 12a and 12b (step S105). If the address signal does not agree with the address data of the faulty region, i.e. if the address signal is a signal for accessing a normal region in the memory space 2, a signal indicating the agreement is sent to the address data selecting circuit 14, which directly transfers the signal to the address decoder 3 (step S106). The address decoder 3 accesses (selects) the memory cell M specified by the address signal.

(4) A write/read signal is input to the write/read control signal input section 7 from the outside. In response to the write/read control signal, the write/read control signal generating circuit 4 makes the data signal input/output controlling circuit 5 ready for the write or read operation. When made ready for the write operation, the data signal input/output controlling circuit 5 allows the data, which are received from the outside via the data input/output section 8, to be written, in the accessed memory cell M in the memory space 2. When put into the read operation, the data signal input/output controlling circuit 5 can read the data, which has been written in the accessed memory cell M in the memory space 2, to the outside (step S107).

(5) On the other hand, when the first address agreement/disagreement detecting circuit 11 detects that the address signal agrees with the address data of the faulty region (step S105), i.e. when the address signal is the signal for accessing the faulty region 210 or 211, a signal indicating this is sent to the address data selecting circuit 14. The address data selecting circuit 14 provides the address decoder 3 with the replace address data 13a and 13b (step S108). In other words, when the address signal agrees with the address data 12a of the faulty region 210, the replace address data 13a of the relief region 210A, which has been relocated to a part 211 of the final address side 201 in the normal regions in the memory space 2, are sent to the address decoder 3. Similarly, when the address signal agrees with the address data 12b of the faulty region 211, the replace address data 13b of the relief region 211A, which has been relocated to a part 212 of the final address side 201 in the normal regions in the memory space 2, are sent to the address decoder 3. The address decoder 3 can access the memory cells M specified by the replace address data 13a and 13b.

(6) When the data signal input/output control circuit 5 is controlled to the write operation, the data are written into the memory cell M, which has been accessed in accordance with the replace address data 13a or 13b, from the outside via the data signal input/output section 8. Conversely, when data signal input/output control circuit 5 is controlled to the read operation, the data are read to the outside from the memory cell M accessed in accordance with the replace address data 13a or 13b (step S107).

(7) In the memory space controller 10, the first address agreement/disagreement detecting circuit 11 detects whether or not the address signal agrees with the address data of the faulty regions (step S105), and the second address agreement/disagreement detecting circuit 15 detects whether or not the address signal agrees with the replace address data stored in the replace address storing table unit 13 (step S109). If the address signal does not agree with the replace address data, i.e. if the address signal is a signal for accessing the normal region in the memory space 2, this is informed to the write/read control signal generating circuit 4 (Especially, to output a signal at the write/read control signal generating circuit 4 isn't necessary.). The write/read control signal generating circuit 4 transmits, as usual, a signal for controlling the write or read operation in the data signal input/output control circuit 5, in accordance with the write/read control signal input into the write/read control signal input section 7. Therefore, the data are normally written into or read from the memory cell M as usual.

Conversely, when the address signal agrees with the replace address data, i.e. when the address signal is a signal for accessing the relief region 210A or 211A in the memory space 2, a write/read prohibiting signal is output to the write/read control signal generating circuit 4, which controls the data signal input/output controlling circuit 5 in order to prohibit the data reading or writing of the relief region 210A or 211A.

Further, when the address signal agrees with the replace address data, the second address agreement/disagreement detecting circuit 15 provides the invalid signal output section 16 with an invalid signal indicating that the address signal is for accessing either the relief region 210A or 211A (step S111). Specifically, a high level invalid signal is output when the address signal agrees with the replace address data (i.e. when the address signal is invalid), while a low level invalid signal is output when the address signal does not agree with the replace address data (i.e. when the address signal is valid). The invalid address signal is transmitted to the outside from the invalid signal output section 16. The user can know whether or not access to the memory space 2 is valid or invalid, on the basis of the invalid address signal, so that the user can take appropriate steps.

As described above, the memory space controller 10 and the semiconductor memory 1 including the memory space controller 10 can replace the faulty regions 210 and 211 of the memory space 2 with the part 212 of the normal regions in order to relieve the faulty regions 210 and 211. As a result, no fixed redundancy circuit separate from the memory space 2 will be required (because the redundancy regions are variable ). Therefore, the semiconductor memory 1 can be further integrated since no fixed redundancy circuit is provided. This enables the semiconductor memory 1 to have a larger capacity. Still further, relief of the faulty regions 210 and 211 contributes to improving the yield of the manufacturing process.

In addition, the memory space controller 10 and the semiconductor memory 1 including the memory space controller 10 replaces the faulty regions 210 and 211 with the relief regions 210A and 211A, thereby realizing a continuous address space, which prevents the faulty regions 210 and 211 from being unnecessarily accessed and accelerates the access operation.

Still further, the memory space controller 10 and the semiconductor memory 1 including the memory space controller 10 replaces the faulty regions 210 and 211 with the part 212 of the normal regions at the final address side 201 (or the initial address 200) in the memory space 2 as the redundancy region, which facilitates relief of the faulty regions 210 and 211. Access to the relief regions 210A and 211B which have replaced the faulty regions 210 and 211 is facilitated, and access to the relief regions 210A and 211B can be easily controlled.

The memory space controller 10 and semiconductor memory 1 including the memory space controller 10 comprises at least the faulty address storing table unit 12, replace address storing table unit 13, first address agreement/disagreement detecting circuit 11 and address data selecting circuit 14, so that it is possible to relieve the faulty regions 210 and 211 and improve the circuit integration without any problem. Further, the faulty address data 12a and 12b of the faulty regions 210 and 211 stored in the faulty address storing table unit 12 and the replace address data 13a and 13b stored in the replace address storing table unit 13 can be updated, which enables the faulty regions 210 and 211 to be relieved during the manufacturing process, the accelerated tests, the use by the user, and so on.

The memory space controller 10 and semiconductor memory 1 including the memory space controller 10 further includes at least the second address agreement/disagreement detecting circuit 15 and the invalid signal output section 16 in order to transmit the invalid address signal to the outside. This prevents illegal access beforehand and facilitates configuration of the system.

In the first embodiment, the semiconductor memory 1 includes the memory space controller 10. Alternatively, the memory space controller 10 may be configured as a semiconductor chip separate from the semiconductor memory 1.

SECOND EMBODIMENT OF THE INVENTION
[CONFIGURATION OF SEMICONDUCTOR CIRCUIT SYSTEM]

Figure 5:
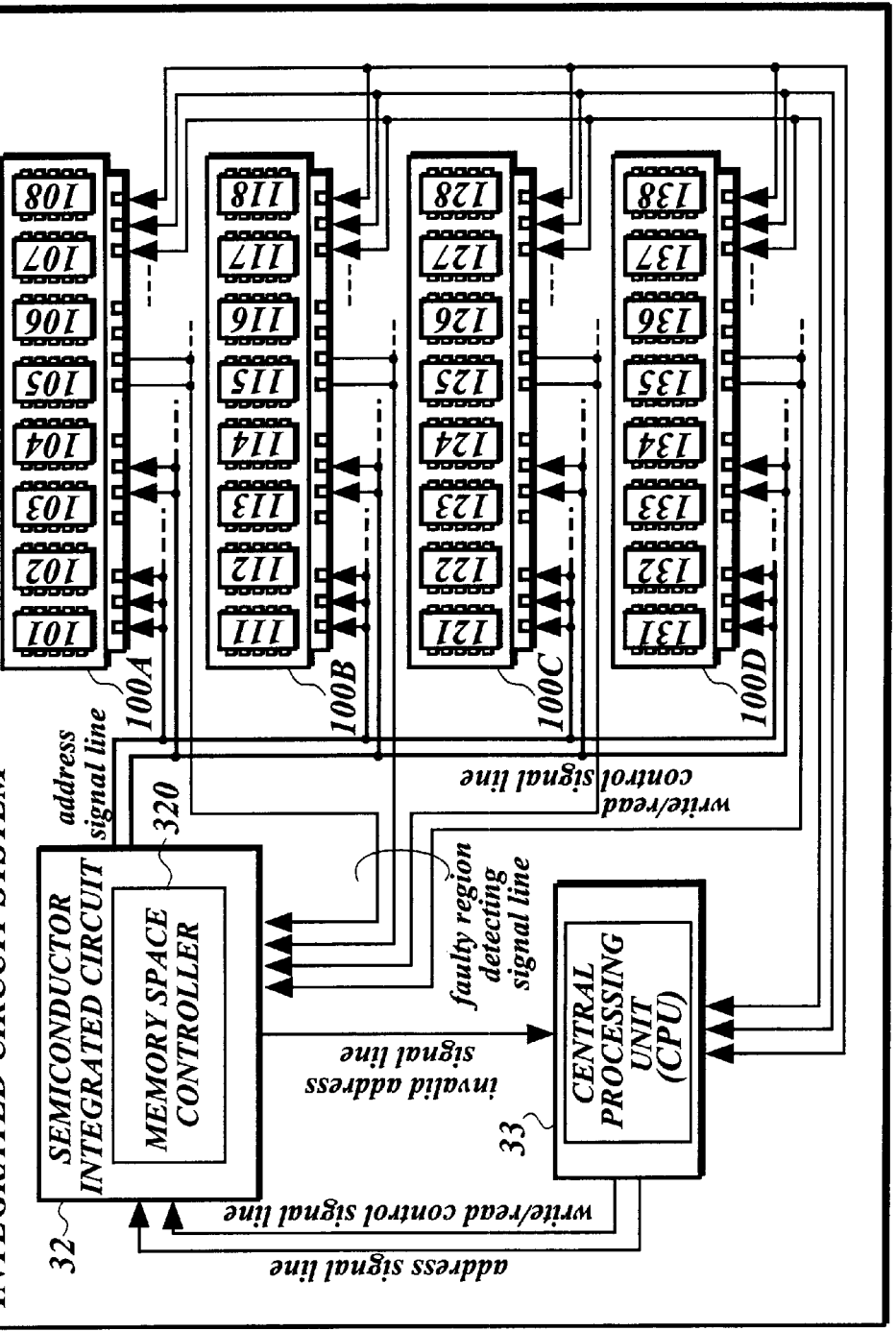
FIG. 5 shows the system configuration of an integrated circuit system according to a second embodiment.

Referring to FIG. 5, a semiconductor circuit system 30 according to the second embodiment of the invention comprises: a central processing unit (CPU) 33; a plurality of memory modules 110A to 100D; and a semiconductor integrated circuit 32 including at least a memory space controller 320, all of which are mounted on a system board 31.

The system board 31 is a so-called mother board, logic board, memory board or the like, and is a printed circuit board (PCB) constituted by an epoxy resin board and wirings arranged thereon.

A total of four memory modules 100A, 100B, 100C and 100D are mounted on the system board 31, with the memory module 100A positioned at the top and the memory module 100D positioned at the bottom as shown in FIG. 5, i.e. a 4-bank configuration is employed. However, the number of the memory modules is not always limited to four. A total of eight semiconductor memories 101 to 108 are mounted on the memory module 100A. However, the number of semiconductor memories is not always limited to eight. The semiconductor memories 101 to 108 are sequentially arranged from left to right on a memory module board made of an epoxy resin substrate, and are electrically connected with one another using the wirings on the memory module board. Each of the memory modules 100B, 100C and 100D is provided with a total of eight semiconductor memories 111 to 118, 121 to 128, and 131 to 138, respectively. A total of 32 semiconductor memories 101 to 108, 111 to 118, 121 to 128, and 131 to 138 are identical to the semiconductor memory 1 (DRAM) which is used in the first embodiment. Each group of semiconductor memories 101 to 108, 111 to 118, 121 to 128, and 131 to 138 includes: a memory space 2; an address decoder 3; a write/read control signal generating circuit 4; a data signal input/output controlling circuit 5; an address signal input section 6; a write/read signal input/output controlling section 7; a data signal input/output section 8; and a memory space controller 10.

Figure 6:
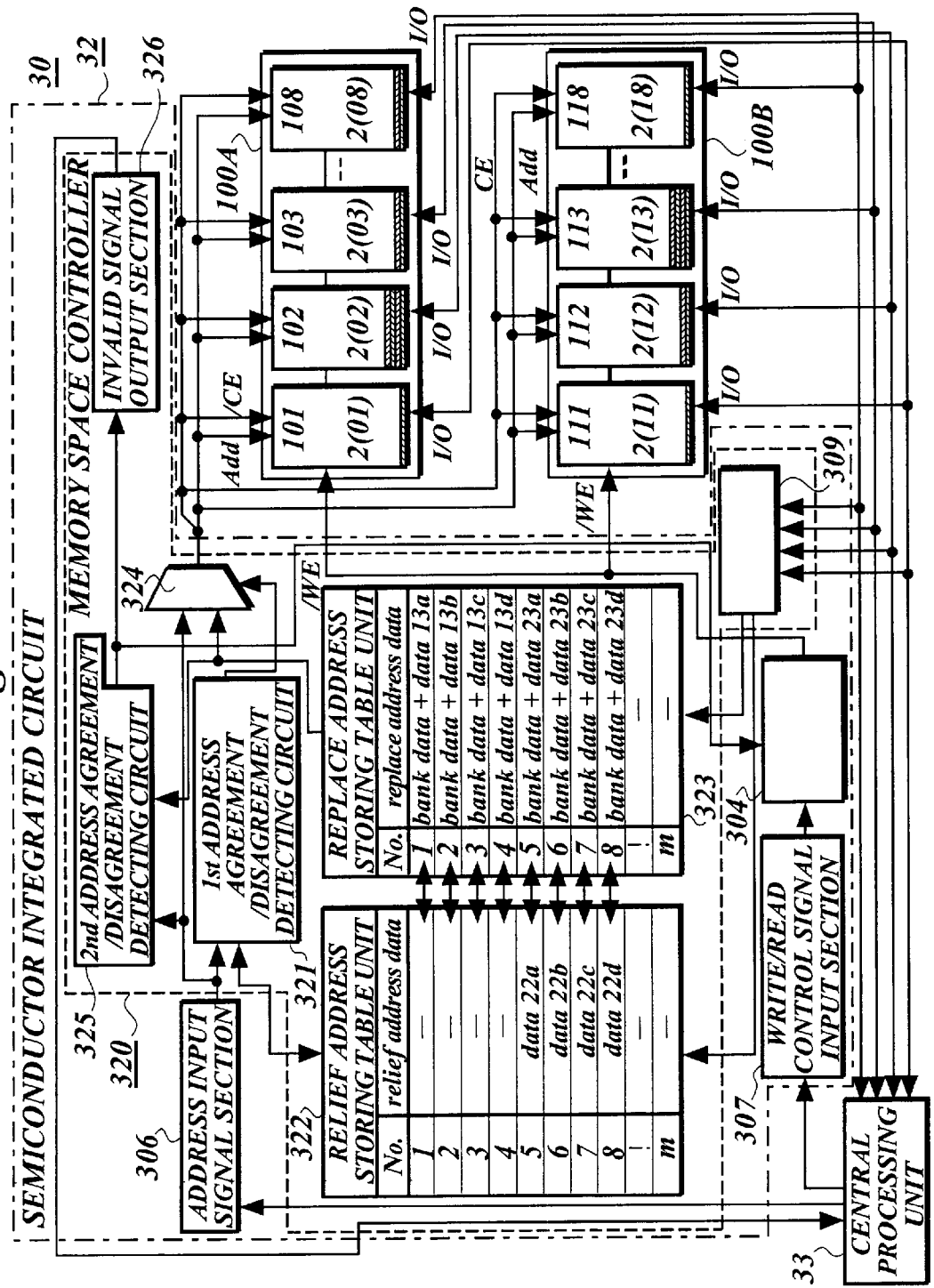
FIG. 6 is a system block diagram of the integrated circuit system in the second embodiment.

In order to simplify the description of the operation of the memory space controller 320 of the semiconductor memory 32, FIG. 6 shows the integrated circuit system 30 in which two memory modules 100A and 100B are arranged so as to accomplish a two-bank configuration. This integrated circuit system 30 has an increased storing capacity in a relief address storing table unit 322, replace address storing table unit 323 and so on, and is essentially identical in the configuration and operation to the foregoing integrated circuit system 30 which includes the four memory modules 100A to 100D of the four-bank configuration and is shown in FIG. 5.

Further, FIG. 6 schematically shows only the memory spaces 2(01), 2(02), 2(08) of the semiconductor memories 101 to 108 of the memory 10 module 100A, and the memory spaces 2(11), 2(12), 2(18) of the semiconductor memories 111 to 118 of the memory module 100B, but does not show the address decoder 3, memory space controllers 10 and so on for the semiconductor memories 101 to 108 and 111 to 118. (For details of these circuits, refer to FIG. 1.)

The semiconductor integrated circuit 32 has the configuration which is identical to a part of the circuits mounted in the semiconductor memory 101, and includes not only a write/read control signal generating circuit 304, an address signal input section 306 and a write/read control signal input section 307 in order to control all of the memory space 2 of the semiconductor 20 memories 101 and so on but also the memory space controller 320. The memory spaces 2(01) to 2(08) and 2(11) to 2(18), address decoder 3, data signal input/output control circuits 5, data signal input/output sections 8 are respectively provided in the semiconductor memories 101 and so on.

In the semiconductor memory 32, the address signal input section 306 receives an address signal from the outside. The received address signal is transmitted to the semiconductor memories 101 to 108 of the memory module 100A, and to the semiconductor memories 111 to 118 of the memory module 100B, respectively.

Low order address signal of address signal is used for the semiconductor memories 101 to 108 while high order address signal of address signal is used for the semiconductor memories 111 to 118. The most significant address signal of address signal is input to chip-enable terminals (/CE) of the semiconductor memories 101 to 108, and to chip-enable terminals (CE) of the semiconductor memories 111 to 118. The chip-enable terminals (/CE) and (CE) are used for address space expanding signal receiving terminals. For instance, when the most significant address signal has a low level, the semiconductor memories 101 to 108 will be selected, so that the address signal is transmitted to the address signal input sections 6 (shown in FIG. 1) of the semiconductor memories 101 to 108. Conversely, when the most significant address signal has a high level, the semiconductor memories 111 to 118 will be selected, so that the address signal is transmitted to the address signal input sections 6 (shown in FIG. 1) of the semiconductor memories 111 to 118.

In the memory module 100A, the address signal is transmitted to the address decoder 3 of the semiconductor memories 101 to 108, so that data lines DL and word lines WL of the memory spaces 2 (01) to 2(08), and a memory cell M having the specified address will be selected (see FIGS. 1 and 2). Similarly, in the memory module 100B, the address signal is transmitted to the address decoder 3 of the semiconductor memories 111 to 118, so that data lines DL and word lines WL of the memory spaces 2(11) to 2(18), and a memory cell M having the specified address will be selected (see FIGS. 1 and 2).

The write/read control signal is input to the write/read control signal input section 307, and is then transferred to the write/read control signal generating circuit 304. In response to the write/read control signal, the write/read control signal generating circuit 304 generates a write/read control signal (/WE) indicating whether data should be written in or read from the memory cell M of the specified address. This write/read control signal (/WE) is input to the write/read control signal input sections 7 of the semiconductor memories 101 to 108 and 111 to 118 (see FIG. 1). As described in connection with the semiconductor memory 1 of the first embodiment, the write/read control signal (/WE) is then transmitted to the data signal input/output controlling circuit 5 via the write/read control signal generating circuit 4. The data signal input/output controlling circuit 5 writes data in the memory cell M of the specified address, or transmits data existing in the memory cell M.

In the semiconductor integrated circuit 32, the memory space controller 320 is positioned between the address signal input section 306 and the address decoder 3 (or the chip-enable terminals (CE) or (/CE)) of the semiconductor memories 101 to 108 and 111 to 118. The memory space controller 320 reserves (appropriates) the relief regions of the memory spaces 2(01) to 2(08) of the semiconductor memories 101 to 108 of the memory module 100A at a part of the normal regions of the memory spaces 2(11) to 2(18) of the semiconductor memories 111 to 118 of the memory module 100B.

Further, the memory space controller 320 can use the relief regions as a continuous address space. For this purpose, the memory space controller 320 reserves the relief regions at a part of the normal regions at the final address side 201 (or the initial address side 200) of the memory spaces 2(11) to 2(18). In the integrated circuit system 30 with the 2-bank configuration of FIG. 6, all of the relief regions that are present in the memory spaces 2(01) to 2(08) of the semiconductor memories 101 to 108 are reserved at the part of the normal regions in the memory spaces 2(11) to 2(18) of the semiconductor memories 111 to 118. In the second embodiment, the term "relief region" is identical to that in the first embodiment, and represents the region which is the part 212 of the normal regions constituting the continuous address space in the memory space 2 and is used in order to relieve the faulty regions. The relief region is created by the memory space controller 10 which are housed in the semiconductor memory 101 and so on.

The relief regions are reserved by a manner which is same in configuration with four of FIG. 5 or more banks. In the case of the 4-bank configuration, the relief regions, which are present in the memory space 2 of the semiconductor memories 101 to 108, 111 to 118 and 121 to 128 on the memory modules 110A to 110C, are reserved in a part of the normal regions of the memory space 2 of the semiconductor memories 131 to 138 of the memory module 100D of the final bank. Similarly to the first embodiment, with the integrated circuit system 30 of the second embodiment, the normal regions at the final address side 201 of the memory space 2 are partially used as the relief regions. This is because that an address of the initial address side 200 is fixed is easy to use.

The memory space controller 320 includes: a relief address storing table unit 322 for storing address data of relief regions used for relieving faulty regions in the memory spaces 2(01) to 2(08) of the memory module 100A; a replace address storing table unit 323 for storing replace address data in which address data of relief regions are replaced with data of a part of the normal regions of the memory spaces 2(11) to 2(18) of the memory module 100B; a first address agreement/disagreement detecting circuit 321 for detecting whether or not the address data of the relief region agrees with an address signal; and an address data selecting circuit 324 for outputting the replace address data to the address decoder 3 of the semiconductor memories 111 to 118 when the address data of the relief region agree with the address signal, or transferring the address signal to the address decoder 3 of the semiconductor memories 101 to 108 and 111 to 118 when the address data do not agree with the address signal.

Further, the memory space controller 320 includes: a relief region quantity detecting circuit 309 for detecting a maximum quantity of relief regions in the memory spaces 2(01) to 2(08) and 2(11) to 2(18) of the semiconductor memories 101 to 108 and 111 to 118; a second address agreement/disagreement detecting circuit 325 for outputting an invalid signal when the replace address data agree with the address signal; and an invalid signal output section 326 for transferring the invalid address signal to the outside from the second address agreement/disagreement detecting circuit 325.

Figure 7:
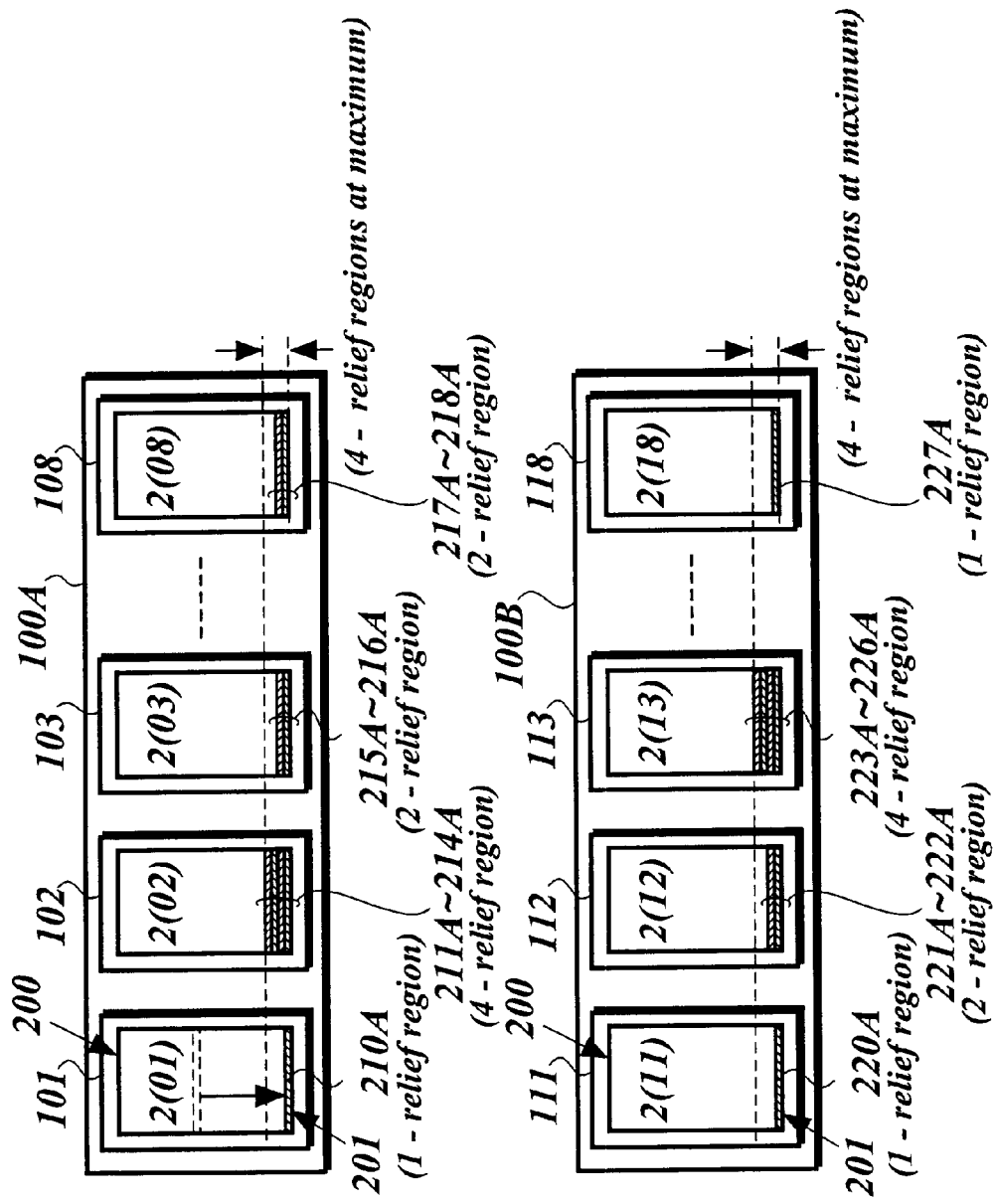
FIG. 7 is a schematic block diagram showing a memory space having faulty regions in the second embodiment.
Figure 8:
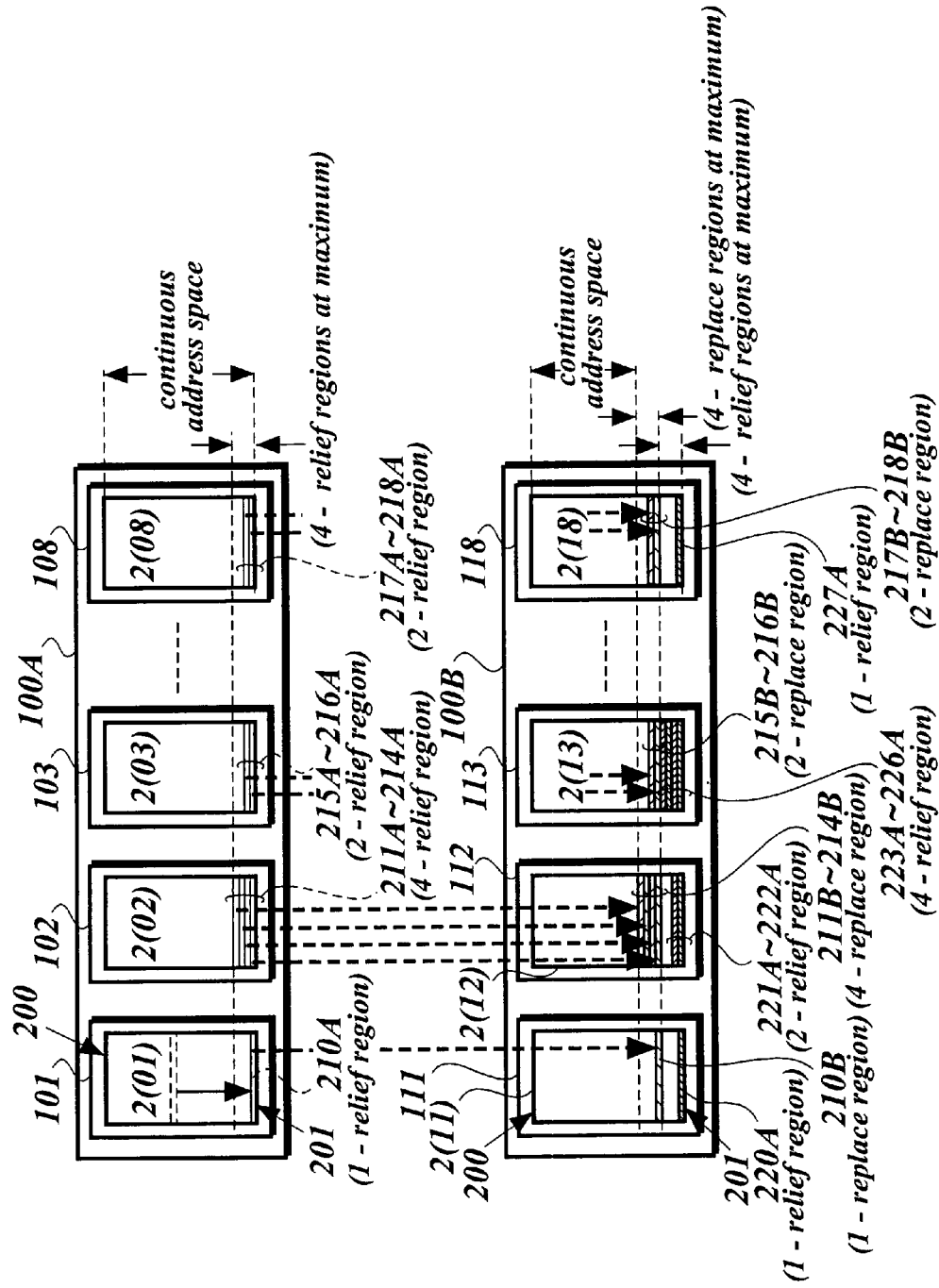
FIG. 8 is a schematic block diagram of the memory space in which faulty regions are replaced with a part of normal regions.

FIG. 7 is a block diagram schematically showing a plurality of memory spaces 2(01) to 2(08) and 2(11) to 2(18) of the memory modules 100A and 100B. FIG. 8 is a schematic block diagram of the memory spaces 2(01) to 2(08) and 2(11) to 2(18) in which a part of the normal regions is used as the relief regions.

Each of the semiconductor memories 101 to 108 and 111 to 118 is provided with a memory space controller 10, not shown, which is identical to that used in the semiconductor memory 1 according to the first embodiment. Referring to FIG. 7, the memory spaces 2(01) to 2(08) and 2(11) to 2(18) of the memory modules 100A and 100B have relief regions for relieving faulty regions using parts of the normal regions at the final address side 201. In other words, since there is one faulty region in the memory space 2(01) of the semiconductor memory 101, the relief region 210A at a part of the normal regions at the final address side 201 is used to relieve the one faulty region. There are four faulty regions in the memory space 2(02) of the semiconductor memory 102, so that four relief regions 211A to 214A are reserved in the normal regions at the final address side 201 in order to relieve the four faulty regions. There are two faulty regions in the memory space 2(03) of the semiconductor memory 103, so that two relief regions 215A and 216A are reserved in the normal regions at the final address side 201 in order to relieve the two faulty regions. Further, since there are two faulty regions in the memory space 2(08) of the semiconductor memory 108, so that two relief regions 217A and 218A are reserved in the normal regions at the final address side 201 in order to relieve the two faulty regions.

On the other hand, since there is one faulty region in the memory space 2(11) of the semiconductor memory 111, the relief region 220A out of the normal regions at the final address side 201 is used to relieve the one faulty region. There are two faulty regions in the memory space 2(12) of the semiconductor memory 112, so that two relief regions 221A and 222A out of the normal regions at the final address side 201 are used in order to relieve the two faulty regions. There are four faulty regions in the memory space 2(13) of the semiconductor memory 113, so that four relief regions 223A to 226A out of the normal regions at the final address side 201 are used to relieve the four faulty regions. Further, since there is one faulty region in the memory space 2(18) of the semiconductor memory 118, one relief region 227A out of the normal regions at the final address side 201 is used to relieve the one faulty region.

The relief address storing table unit 322 stores address data 22*a*, 22*b*, 22*c* and 22*d* of the four relief regions 211A to 214A in the memory space 2(02) which has a maximum number of relief regions (i.e. there are most faulty regions) among the memory spaces 2(01) to 2(08). The address data are stored as described hereinafter. It is assumed here that the relief regions of the memory space 2(02) of the memory module 100A are accessed. In such a case, the address data are made to correspond to the replace address data stored in the replace address storing table unit 323 in order to access the replace regions 211B to 214B in which the address data of the relief regions 211A to 214A of the memory space 2(02) are replaced with the address data of the replace regions 211B to 214B of the memory space 2(12) and laid over the relief regions 221A and 222A of the memory space 2(12) shown in FIG. 8. For the convenience, the data 22*a*, 22*b*, 22*c* and 22*d* are sequentially stored from the initial address side 200 to the final address side 201 of the memory space 2 in the relief address storing table unit 322. The relief address storing table unit 322 stores "m" address data 22*a* to 22*m*.

The capacity for storing the address data is determined when at least designing the number of the semiconductor memory 101 and so on, or the number of banks to be configured. In the case of the 2-bank configuration, the address data storing capacity (i.e. a size of the redundancy region) is approximately 0.10% to 0.40%, or preferably 0.20% of the overall memory storing capacity per memory space 2, when regions used as the relief regions and replace regions are taken into consideration. In the case of 4-bank configuration, the address data storing capacity is approximately 0.20% to 0.80%, or preferably 0.40% of the overall memory capacity per memory space 2. It is possible not only to increase the capacity of the memory space 2 but also to reliably relieve the faulty regions.

The relief address storing table unit 322 of the memory space controller 320 can vary the number of address data within the limit "m", similarly to the memory space controller 10 according to the first embodiment. The address data can be stored during or after the manufacturing process, or during the use by the user. For instance, when the address data should be frequently updated, the relief address storing table unit 322 is provided with a ROM. On the other hand, when the address data should be updated after the semiconductor circuit system 30 is substantially completed, the relief address storing table unit 322 is provided with either EEPROM or EPROM. In other words, the address data of the relief regions are stored in the ROM, the EEPROM or the EPROM. Further, the relief address storing table unit 322 is provided with fuse elements, which are disconnected in order to store the address data of the relief regions.

FIG. 8 shows that the relief regions of the memory spaces 2(01) to 2(08) of the semiconductor memories 101 to 108 of the memory module 100A are relocated, by the memory space controller 10, to a part of normal regions of the memory spaces 2(11) to 2(18) of the semiconductor memories 111 to 118 of the memory module 100B. Specifically, this relocation is performed by placing the address data of the relief regions one over after another starting from the final address side 201 to the initial address side 200.

The relief regions 210A of the memory space 2(02) of the semiconductor memory 101 is placed on the relief region 220A which is the part of normal regions of the memory space 2(11) of the semiconductor memory 111. This part of the normal region is referred to as a "replace region 210B". Similarly, the relief regions 211A to 214A of the memory space 2(02) of the semiconductor memory 102 are placed on the relief regions 221A and 222A which are in the normal regions of the semiconductor memory 112. These parts of the normal region are referred to as "replace regions 211B to 214B". The relief regions 215A and 216A of the memory space 2(03) of the semiconductor memory 103 are placed on relief regions 223A to 226A which are parts of normal regions of the semiconductor memory 113. These parts of the normal region are referred to as "replace regions 215B to 216B". The relief regions 217A and 218A of the memory space 2(08) of the semiconductor memory 108 are placed on a relief region 227A which is a part of normal regions of the semiconductor memory 118. This part of the normal regions is referred to as "replace regions 217B and 218B".

When placing the replace regions one over after another, the maximum number of the relief regions (i.e. the maximum number of faulty regions) of the memory spaces 2(11) to 2(18) of the semiconductor memories 111 to 118 is detected, and the replace regions are placed based on the maximum number as a reference. In the second embodiment, the memory space 2(13) of the semiconductor memory 113 has the four relief regions 223A to 226A. Therefore, the replace regions of the memory spaces 2(01) to 2(08) are placed on fifth and succeeding regions (replace regions) from the final address side 201 of the memory spaces 2(11) to 2(18). Further, since the most relief regions are present in one of the memory spaces 2(01) to 2(08) of the semiconductor memories 101 to 108, the maximum number of relief regions and the maximum number of replace regions will become equal.

All of the relief regions (faulty regions) of the memory spaces 2(01) to 2(08) of the semiconductor memories 101 to 108 of the memory module 100A are relocated to the memory spaces 2(11) to 2(18) of the semiconductor memories 111 to 118 of the memory module 100B. As a result, there is virtually no relief region (faulty region) in the memory spaces 2(01) to 2(08). Further, a continuous and long address space virtually exists between the memory spaces 2(01) to 2(08) of the memory module 100A and the memory spaces 2(11) to 2(18) of the memory module 100B.

The replace address storing table unit 323 stores the replace address data 23a, 23b, 23c and 23d, which correspond to the four replace regions 211B to 214B (shown in FIG. 8), of the memory spaces 2(11) to 2(18). Further, the replace address storing table unit 323 stores the replace address data 13a, 13b, 13c and 13d, which correspond to the four relief regions 223A 20 to 226A of the memory spaces 2(11) to 2(18), of the memory spaces 2(11) to 2(18). The replace address data 23a, 23b, 23c and 23d of the memory module 100A are placed over the replace address data 13a, 13b, 13c and 13d of the memory module 100B.

In order to effectively use parts of the normal regions of the memory spaces 2(11) to 2(18) (i.e. in order to maximize a length of the continuous address space), the replace address data 13a to 13d and the replace address data 23a to 23d are sequentially stored from the final address side 201 to the initial address side 200 in the replace address storing table unit 323, contrary to the storing order of the data in the relief address storing table unit 322.

The replace address storing table unit 323 includes: a section for storing the replace address data which correspond, on the one-to-one basis, to the address data 22a to 22n of the relief regions stored in the relief address storing table unit 322; and a section for storing the address data of the most relief regions in the memory spaces 2(11) to 2(18) using the memory space controller 10. In other words, the replace address storing table unit 323 can store a total of "m" replace address data including the "n" replace address data 13a to 13n, and "n" replace address data 23a to 23n. The replace address data are preferably stored when storing the address data of the relief regions. Further, the replace address storing table unit 323 is provided with the ROM, the EEPROM or the EPROM, in which the address data of the replace regions are stored.

The replace address data contain bank data indicating whether the memory spaces 2(01) to 2(08) of the memory module 100A or the memory spaces 2(11) to 2(18) of the memory module 100B are being accessed. The most significant address signal used to select the memory module 100A or 100B is usable as the bank data. In this embodiment, when the relief regions of the memory spaces 2(01) to 2(08) are accessed, the replace regions of the memory spaces 2(11) to 2(18) will be actually accessed. Therefore, the most significant address signal "1" is used as the bank data. The data read from the semiconductor memories 101 to 108 and those read from the semiconductor memories 111 to 118 essentially denote the quantity of relief regions, and do not contain the most significant address signal for selecting the banks.

The relief address storing table unit 322 requires a valid flag denoting whether areas for storing the relief address data are valid or invalid. This valid flag is preferably contained in the address data. Similarly, the replace address storing table unit 323 requires a valid flag denoting whether areas for storing the replace address data are valid or invalid. This valid flag is preferably contained in the replace address data.

The first address agreement/disagreement detecting circuit 321 is connected to the address signal input section 306, relief address storing table unit 322 and address data selecting circuit 324, and continuously detects whether or not the address signal, which is input from the outside via the address signal input section 306, agrees with the address data of the relief region (i.e. faulty region) stored in the relief address storing table unit 322, i.e. whether the address signal indicates the address data of the relief region. If the address signal agrees with the address data, i.e. it is an address signal of a relief region of any of the memory spaces 2(01) to 2(08) of the memory module 100A, this is informed to the address data selecting circuit 324. Conversely, if the address signal does not agree with the address data, i.e. if it relates to the normal regions of the memory spaces 2(01) to 2(08) and 2(11) to 2(18), it will be directly output to the address decoder 3 (see FIG. 1) of the semiconductor memories 101 and so on via the address data selecting circuit 324.

The address data selecting circuit 324 is connected to the address signal input section 306, first address agreement/disagreement detecting circuit 321 and replace address storing table unit 323. In response to the signal sent from the first address agreement/disagreement detecting circuit 321 and indicating that the address signal agrees with the address data of any of the memory spaces 2(01) to 2(08), the address data selecting circuit 324 outputs the replace address data (stored in the replace address storing table unit 323) to the address decoder 3 of any of the semiconductor memories 111 to 118. On the other hand, in response to the signal indicating that the address signal does not agree with the address data of the relief regions, the address data selecting circuit 324 directly transfers the signal from the address signal input section 306 to the address decoder 3 of the semiconductor memories 101 to 108. The address data selecting circuit 324 is constituted by a multiplexing circuit similar to the address data selecting circuit 14 of the memory space controller 10 in the first embodiment.

The second address agreement/disagreement detecting circuit 325 continuously detects whether or not the address signal from the address signal input section 306 agrees with the replace address data. In other words, when the address signal represents the data 23a to 23n and corresponds to the address data of the relief regions of the memory spaces 2(01) to 2(08), the operation prohibiting signal will be output to the invalid signal output section 326 and write/read control signal generating circuit 304.

The invalid signal output section 326 transfers the invalid signal from the second address agreement/disagreement detecting circuit 325 to the central processing unit 33.

The relief region quantity detecting circuit 309 reads and detects the quantity of the relief regions (faulty regions) from the data signal input/output section (I/O terminal) 8 of the semiconductor memories 101 to 108, and the quantity of the relief regions from the data signal input/output section (I/O terminal) 8 of the semiconductor memories 111 to 118. The detected quantity data are stored in the relief address storing table unit 322 and the replace address storing table unit 323. In other words, the relief address storing table unit 322 stores the quantity data of a maximum of four relief regions 211A to 214A of the memory spaces 2(01) to 2(08). The replace address storing table unit 323 stores the quantity data of a maximum of four relief regions 223A to 226A of the memory spaces 2(11) to 2(18).

The central processing unit 33 shown in FIG. 5 and FIG. 6 not only executes the predetermined processing operations but also outputs the address signal to the address signal input section 306, outputs the write/read control input signal to the write/read control signal input section 307, and sends write data to the memory spaces 2 of the semiconductor memories 101 and so on or receives the existing data from the memory spaces 2. Further, the central processing unit 33 receives the invalid address signal from the invalid signal output section 326 of the semiconductor integrated circuit 32.

[SYSTEM OPERATION OF CIRCUIT]

The system operation of the integrated circuit system 30 will be described with reference to FIGS. 5 to FIGS. 9. For the convenience, the integrated circuit system 30 is assumed to adopt the 2-bank configuration.

(1) First of all, in the semiconductor memories 101 to 108 of the memory module 100A and in the semiconductor memories 111 to 118 of the memory module 100B, the memory space controllers 10 (not shown) relieves the faulty regions of the memory spaces 2(01) to 2(08) and 2(11) to 2(18) by using the relief regions which are parts of normal regions (step S400).

Referring to FIG. 7, one faulty region exists in the memory space 2(01) of the semiconductor memory 101, and the relief region 210A for relieving this faulty region is reserved in the normal regions at the final address side 201. Four faulty regions are present in the memory space 2(02) of the semiconductor memory 102, and the relief regions 211A to 214A are reserved in the normal regions at the final address side 201. Two faulty regions are present in the memory space 2(03) of the semiconductor memory 103, and the relief regions 215A and 216A are reserved in the normal regions at the final address side 201. Further, two faulty regions are present in the memory space 2(08) of the semiconductor memory 108, and the relief regions 217A and 218A are reserved in the normal regions at the final address side 201.

One faulty region is present in the memory space 2(11) of the semiconductor memory 111, and the relief region 220A for relieving the faulty region is prepared at a part of the normal regions at the final address side 201. Two faulty regions are present in the memory space 2(12) of the semiconductor memory 112, and the relief regions 221A and 222A are reserved in the normal regions at the final address side 201. Four faulty regions are present in the memory space 2(13) of the semiconductor memory 113, and the relief regions 223A to 226A are reserved in the normal regions at the final address side 201. Further, one faulty region is present in the memory space 2(08) of the semiconductor memory 118, and the relief region 227A for relieving the faulty region is reserved in the normal regions at the final address side 201.

In the second embodiment, the faulty regions of the semiconductor memories 101 to 108 and the faulty regions of the semiconductor memories 111 to 118 are relieved after they are mounted on the memory boards. Alternatively, the faulty regions may be relieved before mounting the foregoing members on the memory boards (i.e. while they are in a state of semiconductor chips or semiconductor wafers, or the like).

(2) After faulty regions are relieved in the semiconductor memories 101 to 108 and 111 to 118, it is detected whether or not there are still relief regions (faulty regions) in the memory spaces 2(01) to 2(08) of the semiconductor memories 101 to 108 (step S401). When there are still any relief regions, the maximum quantity of the relief regions will be detected (step S403). Similarly, it is detected whether or not there are relief regions (faulty regions) in the memory spaces 2(11) to 2(18) of the semiconductor memories 111 to 118 (step S402). When there is still any relief region, the maximum quantity of the relief regions will be detected (step S404) by the relief region quantity detecting circuit 309 of the memory space controller 320 of the semiconductor integrated circuit 32 constituting the integrated circuit system 30.

(3) In step S405, the relief address storing table unit 322 of the memory space controller 320 (shown in FIG. 6) stores the address data in accordance with the maximum quantity of relief regions in any of the memory spaces 2(01) to 2(08). As shown in FIG. 7, the memory space 2(02) of the semiconductor memory 102 has the maximum of four relief regions 211A to 214A, so that the relief address storing table unit 322 stores the address data 22a to 22d corresponding to the these relief regions 211A to 214A. In this embodiment, all the relief regions are reserved in the normal regions from the final address side 201 to the initial address side 200 of the memory space 2. This means that the addresses of the relief regions are substantially predetermined. Therefore, by detecting the most relief regions 211A to 214A, the address data of the relief regions of the memory spaces 2(01) to 2(08) can be stored in the relief address storing table unit 322. The address data of the relief regions are stored in areas which are not used to store the address data of the relief regions of the memory module 100B, considering the maximum quantity of relief regions of the memory spaces 2(11) to 2(18) of the semiconductor memories 111 to 118.

(4) Further, the replace address storing table unit 323 of the memory space controller 320 stores the replace address data corresponding to the most relief regions in any of the memory spaces 2(11) to 2(18), and the replace address data corresponding to the most relief regions in any of the memory spaces 2(01) to 2(08) on the foregoing replace address data (step S406).

As shown in FIG. 7, since the memory space 2(13) of the semiconductor memory 113 has the four relief regions 223A to 226A, the replace address storing table unit 323 stores the replace address data 13a to 13d corresponding to the relief regions 223A to 226A, and the replace address data 23a to 23d corresponding to the relief regions of the memory module 100A on the foregoing replace address data. The data 22a to 22d stored in the relief address storing table unit 322 correspond, on the one-to-one basis, to the data 23a to 23d stored in the replace address storing table unit 323.

The foregoing relief address data 22a to 22d, and the replace address data 13a to 13d and data 23a to 23d are stored in the relief address storing table unit 322 and the replace address storing table unit 323, respectively, during or after the manufacturing of the integrated circuit system 30, or during the use by the user.

(5) In step S407, the central processing unit 33 receives the address signal from the address signal input section 306 of the integrated circuit system 30 shown in FIG. 6. Then, the first address agreement/disagreement detecting circuit 321 detects whether or not the address signal agrees with the address data 22a and 22b of the relief regions stored in the relief address storing table unit 322 (step S408). When the address signal does not agree with the address data, i.e. when the address signal is for accessing a normal region of any of the memory spaces 2(01) to 2(08), a signal informing this is sent to the address signal selecting circuit 324, which directly transfers the address signal to the address decoder 3 (see FIG. 1) of the semiconductor memories 101 to 108, and 111 to 118 (step S409). The address decoder 3 can access the memory cell M specified by the address signal.

(6) When the write/read control signal input section 307 of the semiconductor integrated circuit 32 receives the write/read control signal from the central processing unit 33, the write/read control signal generating circuit 304 transmits the write/read control signal (/WE) to the write/read control signal input sections 7 of the semiconductor memories 101 to 108 and 111 to 118. Thereafter, the data signal input/output controlling circuit 5 is allowed either to write or read the data via the data signal input/output control section 5 (see FIG. 1). When the write operation is allowed, the data signal input/output controlling circuit 5 can write the data, which are received from the central processing unit 33 via the data signal input/output section 8, in the accessed memory cell M of the memory spaces 2. Otherwise, the data signal input/output controlling circuit 5 reads the data, which are present in the accessed memory cell M of the memory spaces 2, to the central processing unit 33 (step S410).

(7) When the first address agreement/disagreement detecting circuit 321 of the memory space controller 320 detects that the address signal agrees with the address data 22a to 22d of the relief regions stored in the relief address storing table unit 322 (step S408), i.e. when the address signal is a signal for accessing any of relief regions of the memory spaces 2(01) to 2(08) of the semiconductor memories 101 to 108, this is informed to the address data selecting circuit 324. The expression "accessing the relief regions" is identical to "accessing the faulty regions". As described with reference to the semiconductor memory 1 of the first embodiment, the memory space controller 10 relieves the faulty regions using the relief regions which are in the normal regions at the final address side 201, so that the relief regions are actually accessed.

The address data selecting circuit 324 outputs the replace address data 23a to 23d to the address decoder 3 of the semiconductor memories 111 to 118 (step S411). The address decoder 3 access the memory cells M of the replace regions relocated to the memory spaces 2(11) to 2(18).

For instance, when the memory space controller 320 receives, from the central processing unit 33, the address signal for accessing the relief region of the memory space 2(02) of the semiconductor memory 102, the faulty regions are replaced with the relief regions 211A to 214A by the memory space controller 10 (not shown) of the semiconductor memory 102. According to the replace address data of the memory space controller 320 of the semiconductor integrated circuit 32, the regions 211A to 214A are relocated to parts of the normal regions, i.e. to the replace regions 211B to 214B which are placed on the relief regions 221A to 222A of the memory space 2(12) of the semiconductor memory 112 of the memory module 100B. As a result, it is possible to access the memory cells M of the replace regions 211B to 214B.

(8) When the data signal input/output controlling circuit 5 is put into the write operation of the semiconductor memories 101 to 108 and 111 to 118 in response to the write/read control signal (/WE), the central processing unit 33 writes data into the accessed memory cells M via the data signal input/output section 8 on the basis of the replace address data 23a to 23d. Conversely, when the data signal input/output controlling circuit 5 is allowed to perform the read operation, the central processing unit 33 can read the data from the accessed memory cells M on the basis of the replace address data 23a to 23d (step S410).

(9) In the memory space controller 320, the first address agreement/disagreement detecting circuit 321 detects whether or not the address signal agrees with the replace address data, and the second address agreement/disagreement detecting circuit 325 detects whether or not the address signal agrees with the replace address data 23a to 23d (step S412). When the address signal does not agree with the replace address data, this is informed to the write/read control signal generating circuit 304. In response to the write/read control signal received in the write/read control signal input section 307, the write/read control signal generating circuit 304 outputs a signal for controlling the write or read operation to the data signal input/output controlling circuits 5 of the semiconductor memories 101 to 108 and 111 to 118. As a result, the data can be written into or read from the memory cells M (step S410).

Conversely, when the address signal agrees with the replace address data, i.e. when the address signal is for accessing the memory spaces 2(11) to 2(18) of the memory module 100B which are prepared as the relief regions of the memory spaces 2(01) to 2(08) of the memory module 100A, the operation prohibiting signal is output to the write/read control signal generating circuit 304. Thereafter, the write/read control signal generating circuits 304 prevent the data of the relief regions from being written and read by the data signal input/output controlling circuits 5 of the semiconductor memories 111 to 118 (step S414).

Further, when the address signal agrees with the replace address data, the second address agreement/disagreement detecting circuit 325 outputs the invalid address signal to the invalid signal output section 326 in order to indicate that the address signal does not allow the access to the replace regions of the memory module 100B for relocating the relief regions of the memory module 100A (step S413). The invalid signal output section 326 transmits the invalid address signal to the central processing unit 33. Specifically, when the address signal agrees with the replace address data (i.e. when it is invalid), the invalid address signal has a high level. When they do not agree with each other (i.e. when it is valid), the invalid address signal has a low level. The user can know whether or not access to the memory space 2 is valid, on the basis of the invalid address signal, and can take necessary measures.

As described above, the integrated circuit system 32 constituted by the semiconductor integrated circuit 30 of this embodiment includes the memory space controller 320, and can relocate the relief regions of the memory spaces 2(01) to 2(08) to the parts of normal regions of the memory spaces 2(11) to 2(18). The parts where the relief regions are relocated are referred to as the replace regions.

Further, in the second embodiment, the parts of normal regions of the memory spaces 2(11) to 2(18) of the memory module 100B are used as the replace regions where the relief regions of the memory spaces 2(01) to 2(08) of the memory module 100A are relocated. Since no fixed redundancy circuit independent from the memory spaces 2(01) to 2(08) and 2(11) to 2(18) is used for the replace regions, the semiconductor memories 101 to 108 and 111 to 118 can be further integrated due to the lack of the redundancy circuit. This enables the semiconductor memories 101 to 108 and 111 to 118 to have larger capacities, which leads to a large capacity of the integrated circuit system 30.

With the second embodiment, the relief regions of the memory spaces 2(01) to 2(08) of the memory module 100A are relocated to the normal regions of the memory spaces 2(11) to 2(18) of the memory module 100B. This enables the memory spaces 2(01) to 2(08) to be used as the continuous and long address space which is virtually free from faulty regions. This is effective in preventing unnecessary access to the faulty regions and accelerating the accessing operation.

According to the second embodiment, it is possible to relieve the faulty regions, and to improve the yield of the process for manufacturing the semiconductor memories 101 to 108 and 111 to 118.

Finally, the integrated circuit system 30 includes the relief region quantity detecting circuit 309 for detecting the maximum quantity of relief regions of each of the memory modules 100A to 100D. The relief address data in the relief address storing table unit 322 and the replace address data in the replace address storing table unit 323 can be updated on the basis of the detected maximum quantity of relief regions. Therefore, the relief regions can be relocated between the semiconductor memories 101 to 108, 111 to 118, 121 to 128 of the memory modules 100A to 100C and the semiconductor memories 131 to 138 of the memory module 100D. In other words, a semiconductor memory having extremely many faulty regions can be replaced with another one. This can increase the capacity of the integrated circuit system 30, and improve the yield of the process for manufacturing the integrated circuit system 30.

THIRD EMBODIMENT OF THE INVENTION

In this embodiment, the semiconductor integrated circuit 32 includes a faulty region address detecting circuit in place of the relief region quantity detecting circuit 309.
[CONFIGURATION OF INTEGRATED CIRCUIT SYSTEM]

Figure 10:
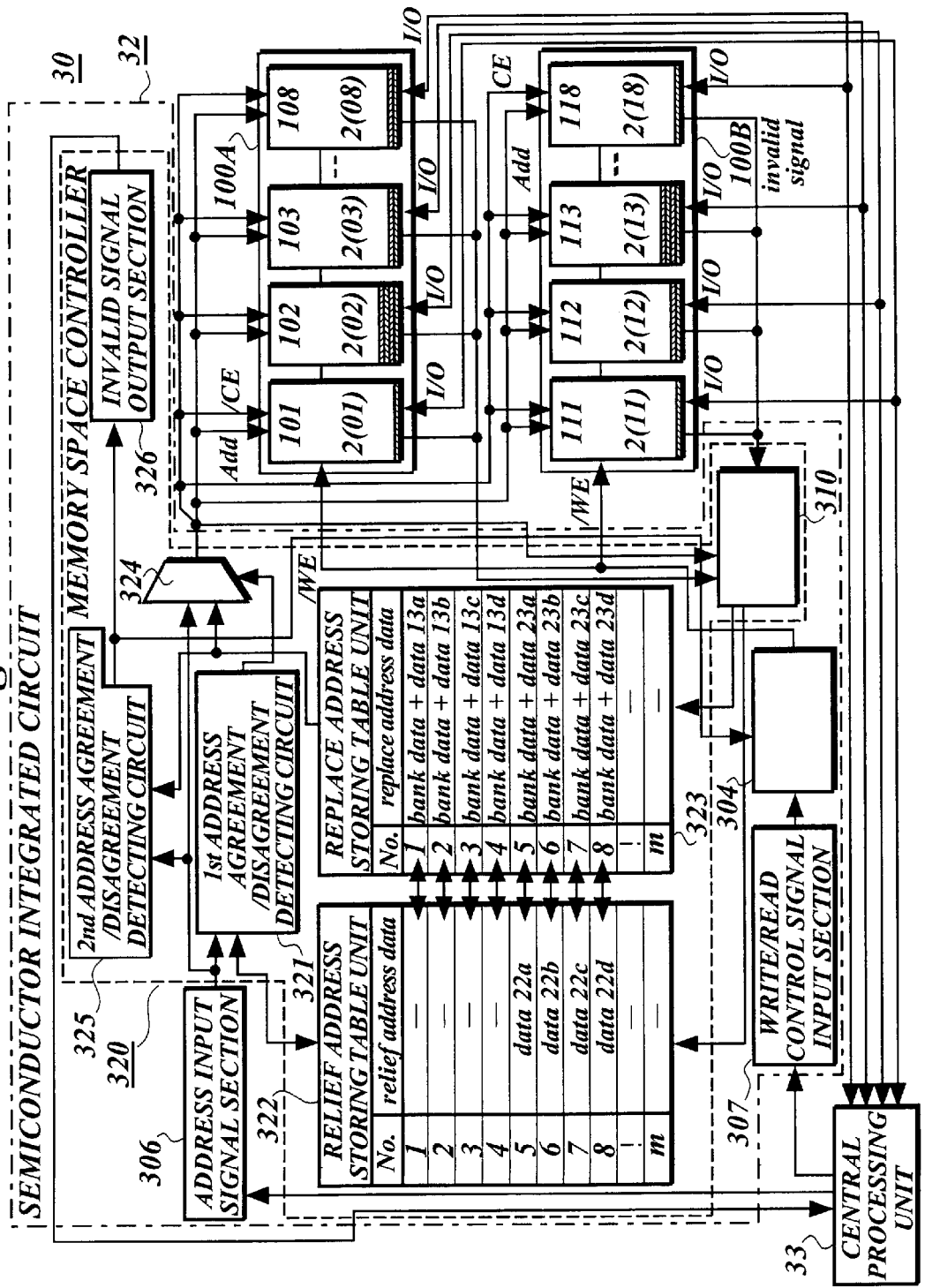
FIG. 10 is a system block diagram of an integrated circuit system according to a third embodiment.

Referring to FIG. 10, an integrated circuit system 30 comprises the semiconductor integrated circuit 32 which includes at least the central processing unit 30, memory modules 100A and 100B (actually four memory modules 100A to 100D are included, i.e. the 4-bank structure), and the memory space controller 320. The integrated circuit system 30 of the third embodiment is substantially identical to the integrated circuit system 30 of the second embodiment, but differs from the second embodiment in that the relief region quantity detecting circuit 309 is replaced with a faulty region address detecting circuit 310.

The faulty region address detecting circuit 310 has its input side connected to the address data selecting circuit 324, and the invalid signal output sections 16 (refer to FIG. 1) of the semiconductor memories 101 to 108 and 111 to 118 of the memory modules 100A and 100B, respectively. An output side of the faulty region address detecting circuit 310 is connected to the relief address storing table unit 322 and the replace address storing table unit 323.

Specifically, the faulty region address detecting circuit 310 accesses all the memory space 2, detects whether or not the invalid address signal has been output from the invalid signal output sections 16 of the semiconductor memories 101 to 108 and 111 to 118, checks wired OR (logical add) for each bank, and acquires address data of the relief regions in a bit width direction.

In accordance with the acquired address data of the relief regions, the faulty region address detecting circuit 310 stores the address data 22a to 22d of the relief regions of the memory spaces 2(01) to 2(08) of the semiconductor memories 101 to 108 in the relief address storing table unit 322, and also stores address data 13a to 13d of relief regions of the memory spaces 2(11) to 2(18) of the semiconductor memories 111 to 118 in the replace address storing table unit 323. Further, the replace address storing table unit 323 places the replace address data 23a to 23d, which correspond to the relief address data 22a to 22d on the one-to-one basis, over the relief address data 13a to 13d. In the replace address storing table unit 323, the relief address data 13a to 13d and replace address data 23a to 23d are added most significant address signals as bank data, for example. Further, the replace address storing table unit 323 requires a valid flag in order to indicate whether or not the positions for storing the replace address data 23a to 23d are valid. It is preferable that the valid flag is included in the replace address data.
[SYSTEM OPERATION OF CIRCUIT]

Figure 9:
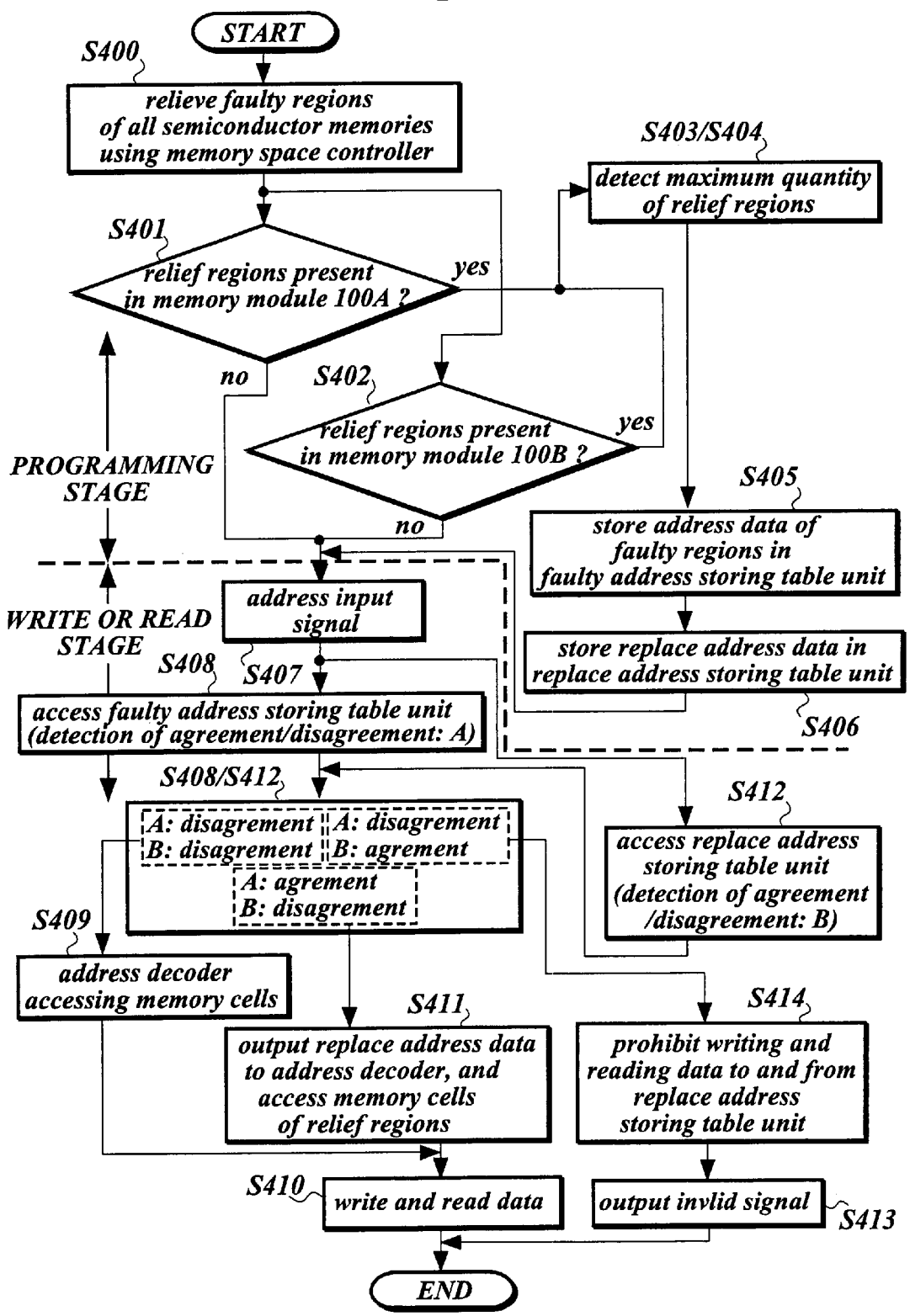
FIG. 9 is a flow chart of the system operation of the integrated circuit system of the second embodiment.

The operation of the integrated circuit system 30 of the third embodiment is identical to that of the second embodiment in the steps following the step S407 (input of the address signal) shown in FIG. 9, and is not described here.

The integrated circuit system 30 including the semiconductor integrated circuit 32 of the third embodiment is as effective as the integrated circuit system 30 of the second embodiment.

Further, in the third embodiment, including the faulty region address detecting circuit 310, the integrated circuit system 30 can increase its capacity and improve the yield of the manufacturing process.

OTHER EMBODIMENTS OF THE INVENTION

Although the invention has been described and illustrated in detail, it is to be clearly understood that the same is by way of illustration and example only, and is not be taken by way of limitation. The invention may be varied in many ways. Such variations are not to be regarded as a departure from the spirit and scope of the invention, and all such modifications as would be obvious to one skilled in the art.

For instance, in the first to third embodiments, the semiconductor memories 1, 101 and so on are constituted by a DRAM. Alternatively, they may be constituted by other devices. For instance, the invention is applicable to a SRAM as a semiconductor memory which can write and read data. Further, the invention is applicable to a ROM which can read data, or an EEPROM, an EPROM or the like which can write and read data. The semiconductor memory may be used as a part of a semiconductor chip, or as a part of a semiconductor chip constituting a logic circuit.

The semiconductor memories 101 and so on are two-dimensionally mounted. Alternatively, they may be three-dimensionally mounted in order to form memory spaces. For instance, the integrated circuit system 30 can use the memory module 100A and so on where the semiconductor memories 101 to 108 are three-dimensionally mounted. Further, the memory spaces may be constituted by three-dimensionally laying the memory modules 100A to 100D over one after another.

It will be obvious that the invention may be varied in many ways. Such variations are not to be regarded as a departure from the spirit and scope of the invention, and all such modifications are intended to be included within the scope of the following claims.

The invention can offer the memory space controller, semiconductor integrated circuit and integrated circuit system which can relieve faulty regions and promote integration of components.

What is claimed is:

1. A semiconductor integrated circuit comprising a memory space controller for outputting address data of a part of normal regions of a memory space on the basis of received address data of a faulty region, and controlling relief of said faulty region using the part of said normal region of said memory space as a variable redundancy region.

2. The semiconductor integrated circuit of claim 1, wherein said memory space controller allows said faulty region to be used as a continuous address space.

3. The semiconductor integrated circuit of claim 1, wherein said memory space controller controls a part of the normal regions at either initial or final address side of said memory space as a redundancy region.

4. The semiconductor integrated circuit of claim 2, wherein said memory space controller controls a part of the normal regions at either initial or final address side of said memory space as a redundancy region.

5. The semiconductor integrated circuit of claim 1, wherein a size of said redundancy region is 0.05% to 0.80% of a total storage capacity of said memory space.

6. The semiconductor integrated circuit of claim 1, wherein said memory space has normal regions with an own address in each.

7. A semiconductor integrated circuit comprising:
   (a) a faulty address storing table unit for storing address data of a faulty region in a memory space;
   (b) a replace address storing table unit for strong replace address data in which the address data of said faulty region are replaced with address data of a part of normal regions in said memory space as a variable redundancy region;
   (c) a first address agreement/disagreement detecting circuit for detecting whether or not said address data of said faulty region and stored in said faulty address storing table unit agree with an address signal; and
   (d) an address data selecting circuit for outputting said replace address data stored in said replace address storing table unit when said address data of said faulty region agree with the address signal, or outputting the address signal when the replace address data does not agree with said address signal.

8. The semiconductor integrated circuit of claim 7 further comprising a second address agreement/disagreement detecting circuit for outputting an invalid address signal when said replace address data agree with said address signal.

9. The semiconductor integrated circuit of claim 7, wherein said address data of said faulty regions stored in said faulty address storing table unit and said replace address data stored in said replace address storing table unit are capable of being updated.

10. The semiconductor integrated circuit of claim 7, wherein said faulty address storing table unit and said replace address storing table unit are constituted by either EPROM or EEPROM.

11. The semiconductor integrated circuit of claim 7, wherein said faulty address storing table unit, said replace address storing table unit, said first address agreement/disagreement detecting circuit and said address data selecting circuit allow the faulty regions to be used as a continuous address space.

12. The semiconductor integrated circuit of claim 7, wherein said faulty address storing table unit, said replace address storing table unit, said first address agreement/disagreement detecting circuit and said address data selecting circuit control a part of normal regions at either initial or final address side in said memory space to be used as a redundancy region.

13. The semiconductor integrated circuit of claim 7 further comprising a memory space and an address signal input section, wherein said faulty address storing table unit, said replace address storing table unit, said first address agreement/disagreement detecting circuit and said address data selecting circuit are disposed between said memory space and said address signal input section.

14. The semiconductor integrated circuit of claim 13, wherein a size of said redundancy region is 0.05% to 0.20% of a total storage capacity of said memory space.

15. The semiconductor integrated circuit of claim 13, wherein said memory space has normal regions with an own address in each.

16. An integrated circuit system comprising:
   (a) a first semiconductor memory including at least a first memory space and a first address decoder;
   (b) a second semiconductor memory including at least a second memory space and a second address decoder;
   (c) a relief address storing table unit for storing address data of a relief region where a faulty region in said first memory is relieved;
   (d) a replace address storing table unit for strong replace address data in which the address data of the relief region are replaced with address data of a part of normal regions in said second memory space as a variable redundancy region;
   (e) a first address agreement/disagreement detecting circuit for detecting whether or not said address data of said relief region stored in said relief address storing table unit agree with an address signal; and
   (f) an address data selecting circuit for outputting said replace address data to said second address decoder when said address data of the relief region agree with said address signal, and outputting said address signal to said first address decoder when said address data of said relief region do not agree with said address signal.

17. The integrated circuit system of claim 16, wherein said first semiconductor memory includes at least:
   a first faulty address storing table unit for storing address data of a faulty region of said first memory space;

a first replace address storing table unit for storing replace address data in which the address data of said faulty regions are replaced with address data of a part of normal regions in said first memory space;

a first address agreement/disagreement detecting circuit for detecting whether or not said address data of said faulty region stored in said first faulty address storing table unit agree with an address signal; and a first address data selecting circuit for outputting the replace address data to said first address decoder when the address data of said relief region agree with said address signal, and outputting said address signal to said first address decoder when said address data of said relief region do not agree with said address signal.

18. The integrated circuit system of claim 16, wherein said second semiconductor memory includes at least:

a second faulty address storing table unit for storing address data of a faulty region of said second memory space;

a second replace address storing table unit for storing replace address data in which said address data of said faulty regions are replaced with said address data of said relief region which is a part of normal regions in said second memory space;

a second address agreement/disagreement detecting circuit for detecting whether or not said address data of said faulty region stored in said first faulty address storing table unit agree with an address signal; and a second address data selecting circuit for outputting said replace address data to said second address decoder when said address data of the faulty region agree with said address signal, and outputting said address signal to said second address decoder when said address data of said relief region do not agree with said address signal.

19. The integrated circuit system of claim 16 further comprising a relief region quantity detecting circuit for detecting a maximum quantity of relief regions of said first memory space of said first semiconductor memory and said second memory space of said second semiconductor memory.

20. The integrated circuit system of claim 16 further comprising a relief region address detecting circuit for detecting address data of relief regions of said first memory space of said first semiconductor memory and said second memory space of said second semiconductor memory.

21. The integrated circuit system of claim 16 further comprising a second address agreement/disagreement detecting circuit for outputting an invalid address signal when said replace address data agree with said address signal.

22. The integrated circuit system of claim 16, wherein said address data of said relief region in said relief address storing table unit and said replace address data in said replace address storing table units are capable of being updated.

23. The integrated circuit system of claim 16, wherein said relief address storing table unit, said replace address storing table unit, said first address agreement/disagreement detecting circuit and said address data selecting circuit allow said faulty regions to be used as a continuous address space.

24. The integrated circuit system of claim 16, wherein said relief address storing table unit, said replace address storing table unit, said first address agreement/disagreement detecting circuit and said address data selecting circuit control a part of said normal regions at either initial or final address side in said memory space to be used as a redundancy region.

25. The integrated circuit system of claim 16, wherein said relief address storing table unit and said replace address storing table unit are constituted by either EPROM or EEPROM.

26. The integrated circuit system of claim 16 further comprising an address signal input section, wherein said relief address storing table unit, said replace address storing table unit, said first address agreement/disagreement detecting circuit and said address data selecting circuit are arranged between said first memory space of said first semiconductor memory and said address signal input section, or said second memory space of said second semiconductor memory and said address signal input section.

27. The integrated circuit system of claim 16, wherein a size of said redundancy region in a 2-bank configuration is 0.10% to 0.40% of a total storage capacity of said memory space.

28. The integrated circuit system of claim 16, wherein a size of said redundancy region in a 4-bank configuration is 0.20% to 0.80% of a total storage capacity of said memory space.

29. The integrated circuit system of claim 16, wherein said first and second memory spaces have normal regions with an own address in each.

* * * * *

UNITED STATES PATENT AND TRADEMARK OFFICE
CERTIFICATE OF CORRECTION

PATENT NO. : 6,414,885 B2
DATED : July 2, 2002
INVENTOR(S) : Nagamatsu et al.

It is certified that error appears in the above-identified patent and that said Letters Patent is hereby corrected as shown below:

Column 23,
Line 53, change "strong" to -- storing --.

Column 24,
Line 49, change "strong" to -- storing --.

Signed and Sealed this

Third day of September, 2002

Attest:

JAMES E. ROGAN
Attesting Officer  Director of the United States Patent and Trademark Office